(12) United States Patent  
Yaita et al.

(10) Patent No.: US 11,923,447 B2  
(45) Date of Patent: Mar. 5, 2024

(54) SEMICONDUCTOR DEVICE, METHOD OF MANUFACTURING SEMICONDUCTOR DEVICE, AND ELECTRONIC DEVICE

(71) Applicant: FUJITSU LIMITED, Kawasaki (JP)

(72) Inventors: Junya Yaita, Atsugi (JP); Atsushi Yamada, Hiratsuka (JP)

(73) Assignee: FUJITSU LIMITED, Kawasaki (JP)

( * ) Notice: Subject to any disclaimer, the term of this patent is extended or adjusted under 35 U.S.C. 154(b) by 126 days.

(21) Appl. No.: 16/929,811

(22) Filed: Jul. 15, 2020

(65) Prior Publication Data

US 2021/0057305 A1 Feb. 25, 2021

(30) Foreign Application Priority Data

Aug. 23, 2019 (JP) .................................. 2019-152859

(51) Int. Cl.
*H01L 29/778* (2006.01)
*H01L 21/48* (2006.01)
(Continued)

(52) U.S. Cl.
CPC ...... *H01L 29/7786* (2013.01); *H01L 21/4807* (2013.01); *H01L 23/3114* (2013.01);
(Continued)

(58) Field of Classification Search
CPC ............ H01L 23/3732; H01L 23/3114; H01L 23/4952; H01L 23/49562; H01L 29/2003;
(Continued)

(56) References Cited

U.S. PATENT DOCUMENTS 5,803,967 A * 9/1998 Plano .................... C23C 16/274  
117/103  
7,306,674 B2 * 12/2007 Dahl ..................... C07C 17/395  
117/106  
(Continued)

FOREIGN PATENT DOCUMENTS

JP 3-50189 A 3/1991  
JP H05-347299 A 12/1993  
(Continued)

OTHER PUBLICATIONS

Notice of Reasons for Refusal dated Feb. 7, 2023 for corresponding Japanese Application No. 2019-152859, with English Translation. (10 pages).

(Continued)

*Primary Examiner* — Natalia A Gondarenko  
(74) *Attorney, Agent, or Firm* — WHDA, LLP

(57) ABSTRACT

A semiconductor device includes a substrate, an insulating layer provided over the substrate, a collection of metal particles exposed on the surface of the insulating layer, and a diamond layer provided on the surface of the insulating layer on which the metal particles are exposed. By controlling the surface density and particle size of the metal particles on the surface of the insulating layer, the surface density of diamond nuclei that are formed on the surface is controlled. Diamond grains are formed by crystal growth using the diamond nuclei as starting material, thereby forming a diamond layer. The control of the surface density of the diamond nuclei results in forming, by the crystal growth, the diamond grains with a grain size exhibiting a relatively high thermal conductivity in the crystal growth initial layer of the diamond layer and improving the thermal conductivity between the diamond layer and the substrate.

13 Claims, 24 Drawing Sheets

(51) Int. Cl.
| | |
|---|---|
| *H01L 23/31* | (2006.01) |
| *H01L 23/373* | (2006.01) |
| *H01L 23/495* | (2006.01) |
| *H01L 29/20* | (2006.01) |
| *H01L 29/205* | (2006.01) |
| *H01L 29/66* | (2006.01) |
| *H01L 29/872* | (2006.01) |
| *H02M 1/42* | (2007.01) |
| *H02M 3/335* | (2006.01) |
| *H03F 3/21* | (2006.01) |

(52) U.S. Cl.
CPC ...... *H01L 23/3732* (2013.01); *H01L 23/4952* (2013.01); *H01L 23/49562* (2013.01); *H01L 29/2003* (2013.01); *H01L 29/205* (2013.01); *H01L 29/66462* (2013.01); *H01L 29/872* (2013.01); *H02M 1/4208* (2013.01); *H02M 1/4225* (2013.01); *H02M 3/33576* (2013.01); *H03F 3/21* (2013.01)

(58) Field of Classification Search
CPC ............ H01L 29/205; H01L 29/66462; H01L 29/7786; H01L 29/872; H01L 29/41766; H01L 29/0843; H01L 29/1066; H01L 2924/181; H01L 21/4807; H01L 21/481; H01L 21/268; H01L 2224/0603; H01L 2224/48091; H01L 2224/48247; H01L 21/02647; H01L 21/02645; H01L 21/02642; H01L 21/02527; H01L 21/02444; H01L 21/02376; H01L 21/02115; H01L 2924/00012; H01L 2924/00014; H01L 29/267; H01L 29/1029; H01L 29/1608; H01L 29/42316; H01L 29/7787; H01L 29/66242; H01L 29/66431; H02M 3/33576; H02M 1/4208; H02M 1/4225; H03F 2200/204; H03F 2200/451; H03F 1/3247; H03F 3/21; H03F 3/245; H03F 3/195; Y02B 70/10
USPC ..... 257/76, 52, 614, 506, 629, 77, 192, 194; 438/455, 759, 694
See application file for complete search history.

(56) References Cited

U.S. PATENT DOCUMENTS

| | | | | |
|---|---|---|---|---|
| 2006/0222850 | A1* | 10/2006 | Xiao | C23C 16/26 428/408 |
| 2007/0126026 | A1* | 6/2007 | Ueno | H01L 23/3732 257/E29.253 |
| 2009/0146186 | A1* | 6/2009 | Kub | H01L 29/42316 257/E29.315 |
| 2010/0015438 | A1* | 1/2010 | Williams | C23C 16/27 428/408 |
| 2014/0110722 | A1 | 4/2014 | Kub et al. | |
| 2014/0209922 | A1* | 7/2014 | Ota | H01L 29/42316 257/194 |
| 2015/0236285 | A1* | 8/2015 | Afzali-Ardakani | H01L 29/51 257/24 |
| 2017/0133295 | A1* | 5/2017 | Gu | H01L 23/3732 |
| 2019/0071779 | A1* | 3/2019 | Hamers | C23C 16/0281 |

FOREIGN PATENT DOCUMENTS

| | | |
|---|---|---|
| JP | H06-263593 A | 9/1994 |
| JP | 2008-103705 A | 5/2008 |

OTHER PUBLICATIONS

Decision of Refusal dated Apr. 18, 2023 for corresponding Japanese Application No. 2019-152859, with English Translation. (8 pages).
Lee et al., "A Nucleation Site and Mechanism Leading to Epitaxial Growth of Diamond Films", Science, Jan. 7, 2000, vol. 287, pp. 104-106. (3 pages).
Anaya et al., "Thermal conductivity of ultrathin nano-crystalline diamond films determined by Raman thermography assisted silicon nanowires", Applied Physics Letters, Jun. 1, 2015, vol. 106, Issue 22. (6 pages).

* cited by examiner

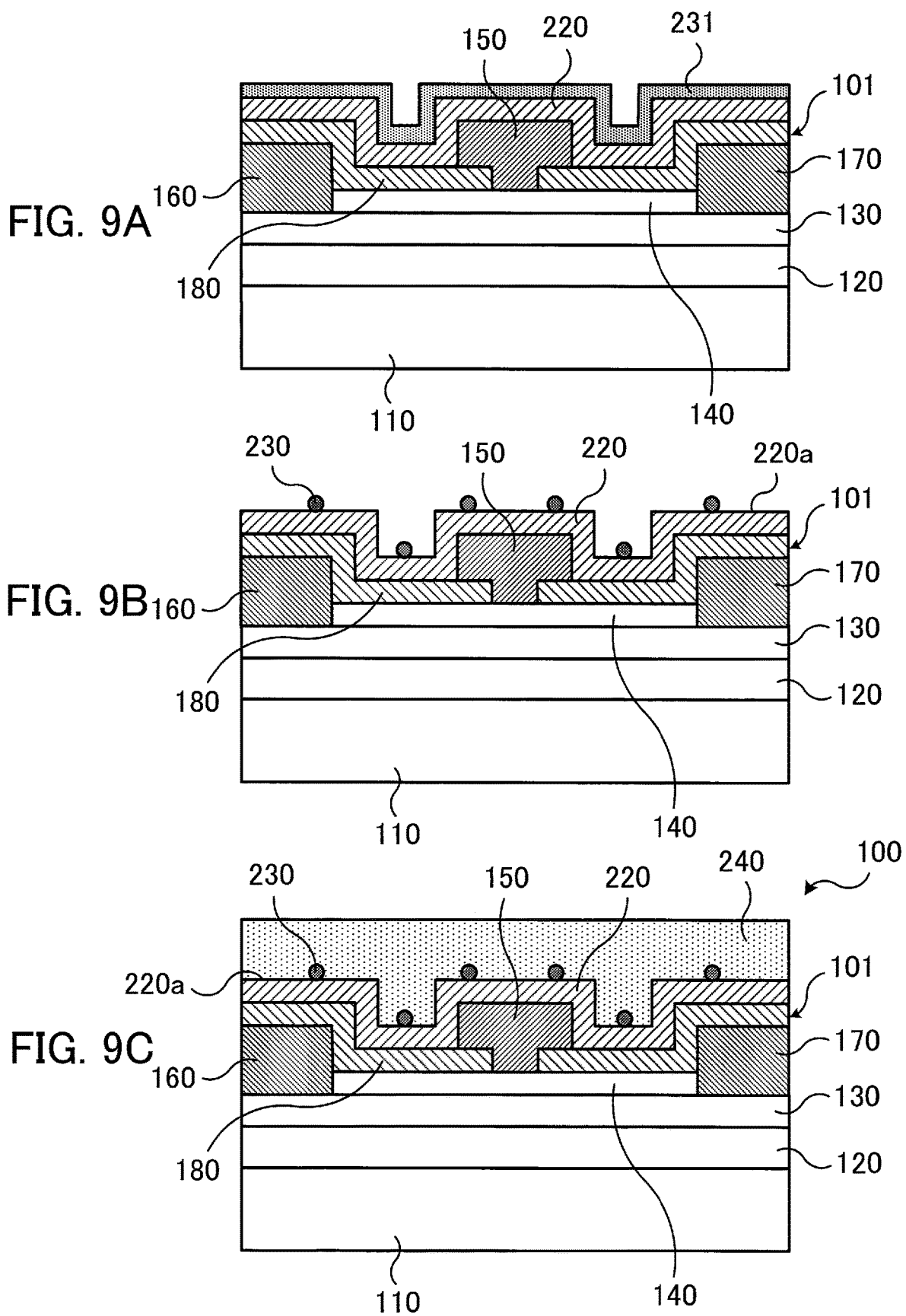

SEMICONDUCTOR DEVICE, METHOD OF MANUFACTURING SEMICONDUCTOR DEVICE, AND ELECTRONIC DEVICE

CROSS-REFERENCE TO RELATED APPLICATION

This application is based upon and claims the benefit of priority of the prior Japanese Patent Application No. 2019-152859, filed on Aug. 23, 2019, the entire contents of which are incorporated herein by reference.

FIELD

The embodiments discussed herein relate to a semiconductor device, a method of manufacturing a semiconductor device, and an electronic device.

BACKGROUND

There have been known techniques of depositing a diamond layer by chemical vapor deposition (CVD). For example, there is a technique in which fine particles of carbide-forming metal element or fine particles of metal carbide are dispersed in a matrix of metal element that does not form carbide in order to thereby produce a base material, and a diamond layer is deposited on the surface of the base material by CVD. In addition, there is another technique in which a diamond layer is deposited by CVD on the surface of a substrate on which a semiconductor device with high heat generation, such as a laser diode, or a semiconductor device using a nitride semiconductor, such as gallium nitride (GaN), is disposed.

See, for example, Japan Laid-open Patent Publication No. 3-50189 and U.S. Patent Application Publication No. 2014/0110722.

Diamond is one of materials with high thermal conductivity. Therefore, it is considered that a diamond layer with a high thermal conductivity, when provided on a substrate with a heat generator, such as a semiconductor device, allows heat generated in the substrate to be dissipated via the diamond layer.

However, in conventional techniques, thermal resistance may be high between a substrate and a diamond layer provided on the substrate, which prevents heat generated in the substrate from being efficiently transferred to the diamond layer and then dissipated.

SUMMARY

According to one aspect, there is provided a semiconductor device including: a substrate; an insulating layer provided over the substrate; a collection of first metal particles provided on a surface of the insulating layer; and a first diamond layer provided on the surface.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 9A to 9C are views for explaining an example of how to manufacture a semiconductor device according to the second embodiment (part 2);

DESCRIPTION OF EMBODIMENTS

First Embodiment

Figure 1:
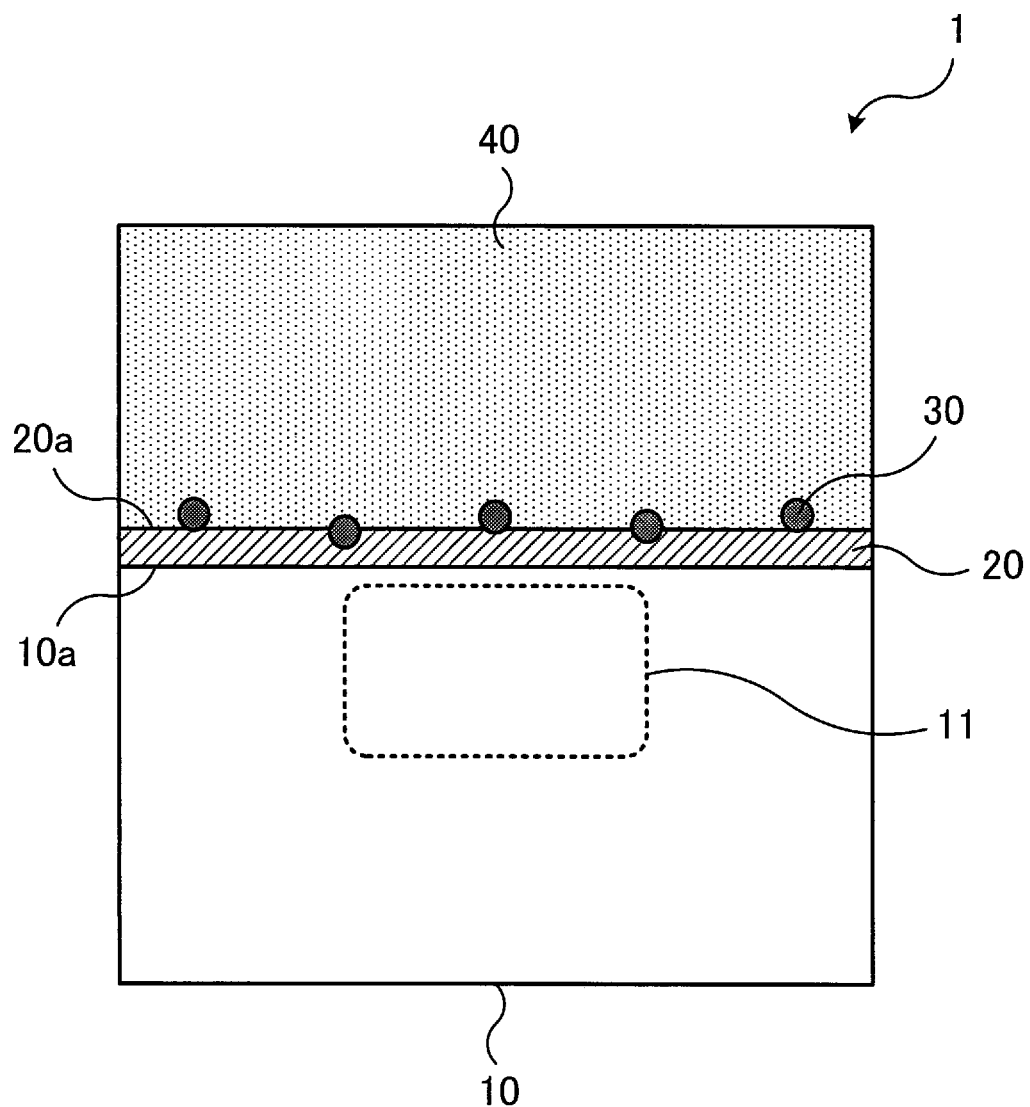
FIG. 1 is a view for explaining an example of a semiconductor device according to a first embodiment.

FIG. 1 is a view for explaining an example of a semiconductor device according to a first embodiment. FIG. 1 is a cross-sectional view schematically illustrating a main part of the example semiconductor device.

The semiconductor device 1 illustrated in FIG. 1 includes a substrate 10, an insulating layer 20, metal particles 30, and a diamond layer 40.

A variety of semiconductor materials and compound semiconductor materials are candidate materials for the substrate 10. The candidate semiconductor materials for the substrate 10 include, but not limited to, silicon (Si) and germanium (Ge). The candidate compound semiconductor materials for the substrate 10 include, but not limited to, GaN, gallium arsenide (GaAs), indium phosphide (InP), silicon carbide (SiC), and silicon germanium (SiGe). The substrate 10 may be made of such semiconductor material or compound semiconductor material. Alternatively, the substrate 10 may be formed by disposing a layer of semiconductor material or compound semiconductor material on another substrate or layer.

The substrate 10 includes a semiconductor element 11, such as a transistor. Examples of the semiconductor element 11 formed in the substrate 10 include, but not limited to, a metal-insulator-semiconductor field-effect-transistor (MIS-FET), a high electron mobility transistor (HEMT), and a Schottky barrier diode (SBD). The semiconductor element 11 is formed in the surface area of or inside of a substrate or layer provided in the substrate 10. This substrate or layer is made of semiconductor material or compound semiconductor material mentioned above. In this case, the substrate 10 may be provided with a wiring layer including a conductive part, such as a wire and a via, for connection to the semiconductor element 11, on the substrate or layer in which the semiconductor element 11 is formed. Since the semiconductor element 11 generates heat during its operation, it is a heat generator in the substrate 10.

In this connection, other than substrates made of a variety of semiconductor materials and compound semiconductor materials mentioned above, a variety of electronic components may be used for the substrate 10, including, but not limited to, semiconductor chips having transistors and others and semiconductor packages in which semiconductor chips are disposed on a circuit board.

The insulating layer 20 is provided on one surface (front surface) 10a of the substrate 10 closer to the semiconductor element 11 (or to the semiconductor element 11 and a wiring layer). A variety of insulating materials are candidate materials for the insulating layer 20, including, but not limited to, silicon oxide (SiO), silicon nitride (SiN), silicon oxynitride (SiON), SiC, and silicon oxycarbide (SiOC). For the insulating layer 20, an insulating material that allows the formation of metal particles 30 thereon using metal materials, to be described later, is selected. The insulating layer 20 may be provided in such a manner as to entirely or partially cover the surface 10a of the substrate 10. The thickness of the insulating layer 20 is not limited to any specific value, but a thinner insulating layer 20 is preferable in an attempt to reduce the thermal resistance between the substrate 10 and the diamond layer 40, to be described later.

A plurality of metal particles 30 are provided in such a manner as to be exposed on the surface 20a of the insulating layer 20. Each metal particle 30 may be provided on the surface 20a of the insulating layer 20. As long as part of a metal particle 30 is exposed on the surface 20a, the remaining part thereof may be embedded inside the insulating layer 20. In addition to the metal particles 30 exposed on the surface 20a of the insulating layer 20, there may be metal particles that are completely embedded inside the insulating layer 20, although their illustration is omitted.

A variety of metal materials (or metal elements) are candidate materials for the metal particles 30. At least one type of metal material that allows the formation of growth nuclei is used for the metal particles 30. The growth nuclei are to grow into the diamond layer 40 by crystal growth, as will be described later. The candidate metal materials for the metal particles 30 include, but not limited to, iridium (Ir), platinum (Pt), nickel (Ni), molybdenum (Mo), tungsten (W), copper (Cu), and gold (Au). Each metal particle 30 may contain one type or two or more types of metal materials selected from Ir, Pt, Ni, Mo, W, Cu, and Au. Metal particles 30 containing two or more types of metal materials may be in the form of an alloy, solid solution, eutectic, intermetallic compound, or another.

The metal particles 30 exposed on the surface 20a of the insulating layer 20 have a prescribed surface density and prescribed particle size, for example. The "surface density" here refers to the density of a collection of metal particles 30 on the surface 20a of the insulating layer 20. The "particle size" here refers to the particle size (diameter) of each metal particle or the average particle size (diameter) of the collection of metal particles 30. The surface density and particle size of the metal particles 30 will be described later.

The diamond layer 40 is provided on the surface 20a of the insulating layer 20 on which the metal particles 30 are exposed. For example, the diamond layer 40 is formed by crystal growth on the surface 20a of the insulating layer 20 using CVD.

The following describes how to form the diamond layer 40 with reference to FIGS. 2A, 2B, 3A, 3B, and 4.

Figure 2A:
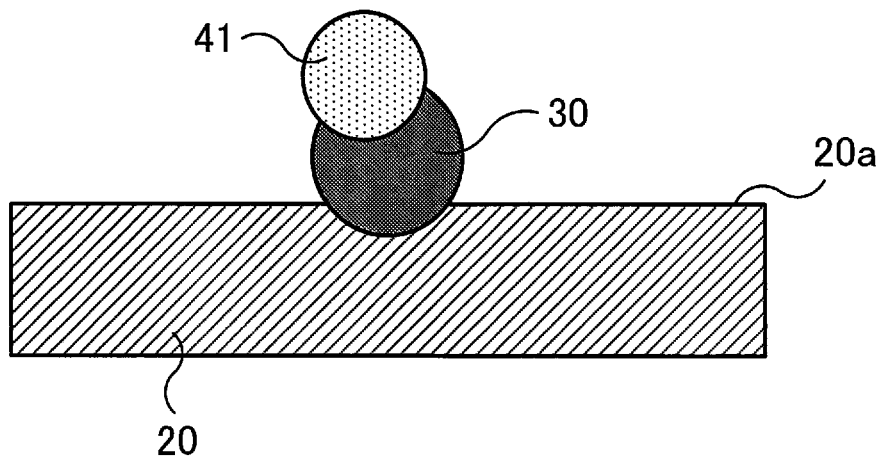
FIGS. 2A and 2B are views for explaining an example of a diamond formation process.
Figure 2B:
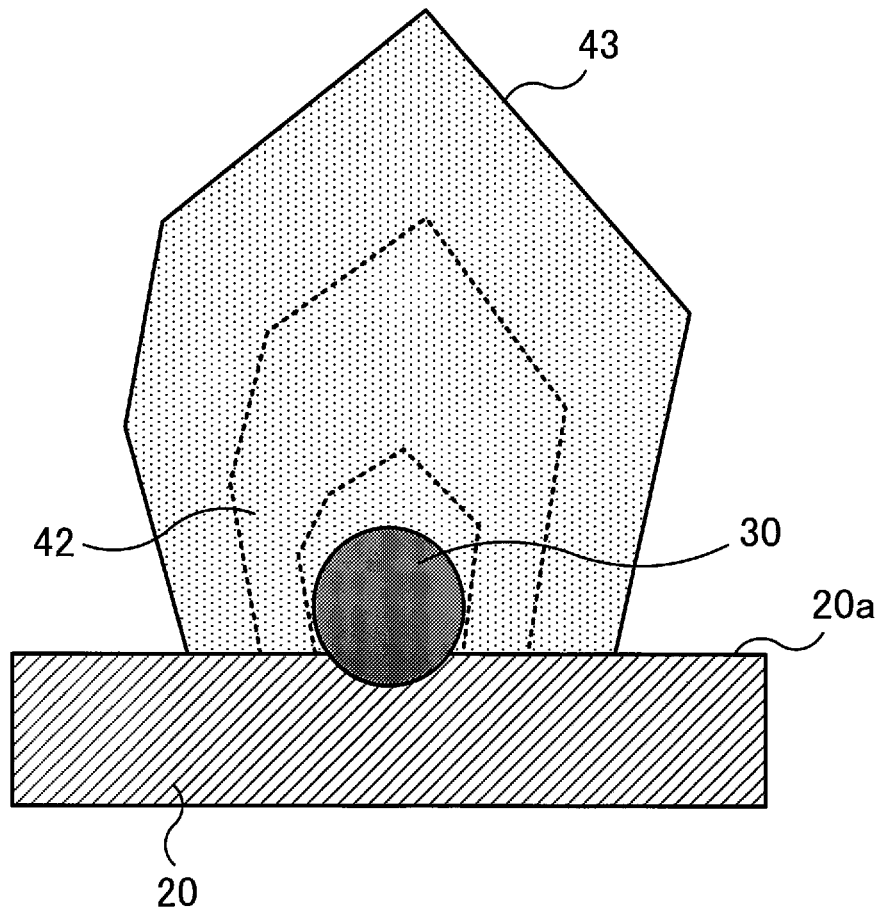

FIGS. 2A and 2B are views for explaining an example of a diamond formation process. FIG. 2A is a cross-sectional view schematically illustrating a main part of an example of a diamond nucleation process. FIG. 2B is a cross-sectional view schematically illustrating a main part of an example of a diamond crystal growth process.

In diamond formation using CVD, the crystal growth of diamond proceeds in a Volmer-Weber mode. First, source gases such as a methane ($Ch_4$) gas and a hydrogen ($H_2$) gas are supplied to form diamond nuclei 41 on metal particles 30 exposed on the surface 20a of the insulating layer 20, as illustrated in FIG. 2A. FIG. 2A illustrates an example in which one diamond nucleus 41 is formed on one metal particle 30. Then, as illustrated in FIG. 2B, the crystal growth proceeds using thus formed diamond nucleus 41 on the metal particle 30 as starting material, so that the diamond nucleus 41 grows into a diamond crystallite 42, which then grows into a diamond grain 43, which is a crystal grain.

While diamond crystallites 42 grow on respective metal particles 30 on the insulating layer 20, the diamond crystallites 42 or diamond grains 43 on different metal particles 30 are coalesced together, thereby forming a polycrystalline diamond layer 40 on the surface 20a of the insulating layer 20.

A metal material is used for the metal particles 30 in the process of FIG. 2A. This metal material is one that allows diamond nuclei 41 to be preferentially or selectively formed on the metal particles 30, compared with the surface 20a of the insulating layer 20. In addition, an insulating material is used for the insulating layer 20. This insulating material is one that does not or hardly allows diamond nuclei 41 to be formed on the surface 20a of the insulating layer 20 or the one that does not allow diamond nuclei 41 to be preferentially or selectively formed on the surface 20a, compared with the metal particles 30.

The formation of the metal particles 30 on the surface 20a of the insulating layer 20 as described above leads to forming the diamond layer 40 containing the diamond grains 43 of relatively large grain size on the surface 20a of the insulating layer 20. With regard to this point, the following describes differences between diamond layers 40 formed on the surfaces 20a of insulating layers 20 with and without metal particles 30, with reference to FIGS. 3A, 3B, and 4.

Figure 3A:
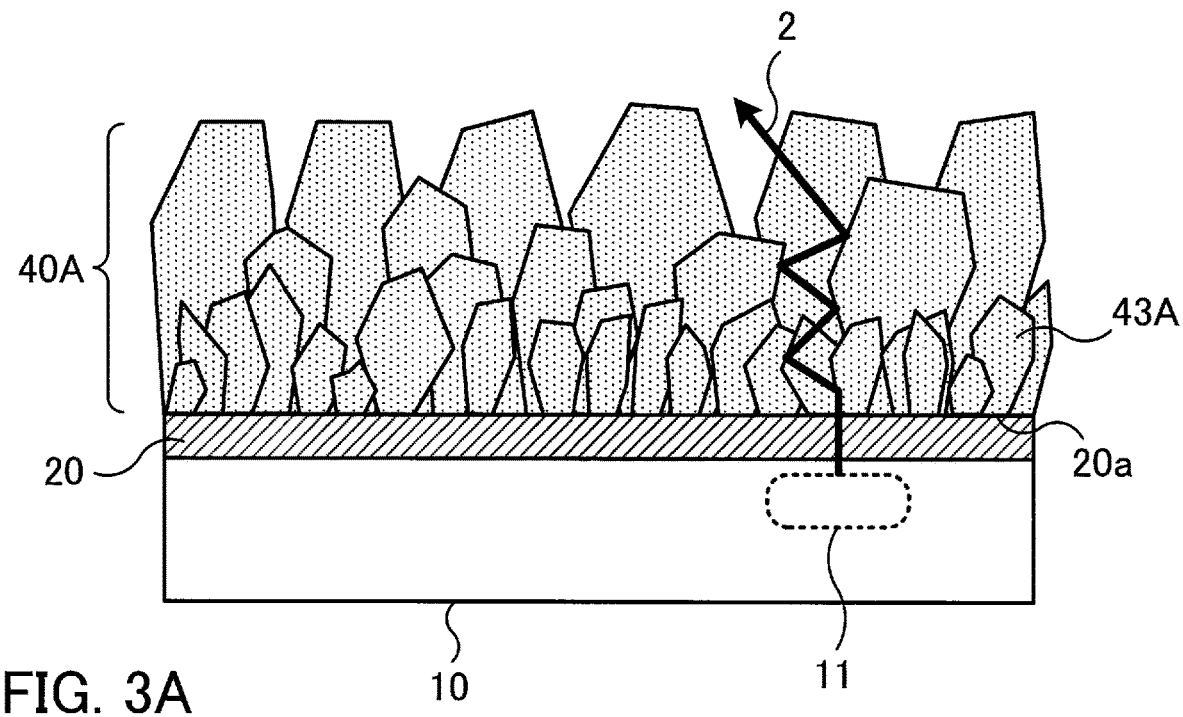
FIGS. 3A and 3B are views for explaining differences between diamond layers formed on insulating layers with and without metal particles.
Figure 3B:
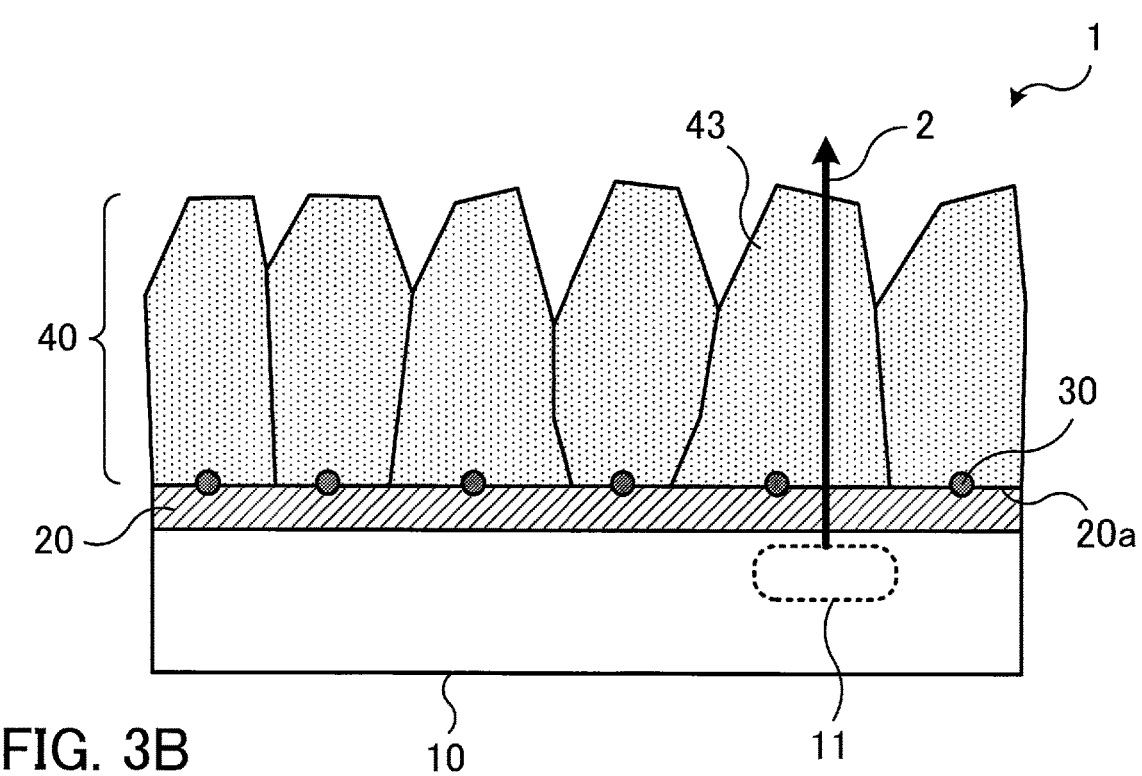
Figure 4:
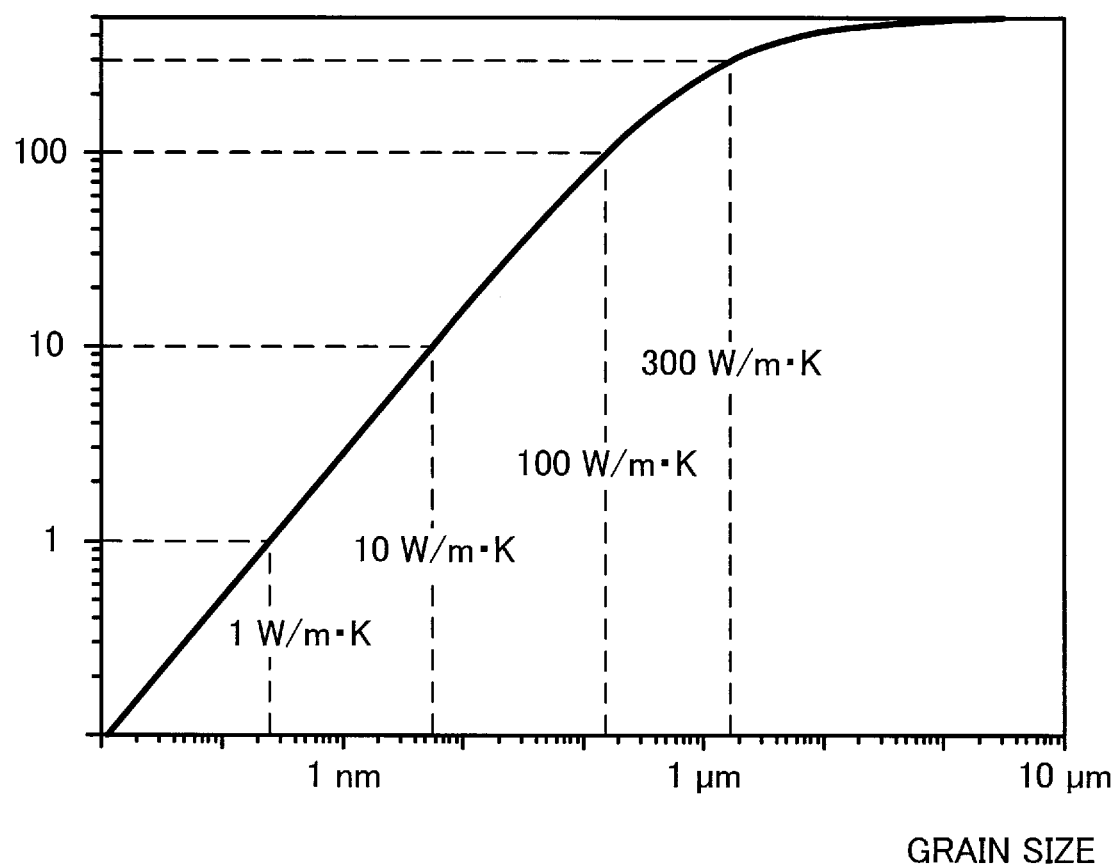
FIG. 4 illustrates the relationship between the grain size of diamond grains and the thermal conductivity of a diamond layer.

FIGS. 3A and 3B are views for explaining differences between diamond layers formed on insulating layers with and without metal particles. FIG. 3A is a cross-sectional view schematically illustrating a main part of an example of a case where diamond grains are formed by crystal growth on an insulating layer without metal particles. FIG. 3B is a cross-sectional view schematically illustrating a main part of an example of a case where diamond grains are formed by crystal growth on an insulating layer with metal particles. In addition, FIG. 4 illustrates the relationship between the grain size of diamond grains and the thermal conductivity of a diamond layer.

FIG. 3A illustrates an example where diamond grains 43A are formed by crystal growth on the surface 20a of an insulating layer 20 without metal particles 30 to thereby form a diamond layer 40A. To form the diamond grains 43A by crystal growth on the surface 20a of the insulating layer 20 without metal particles 30, a method of dispersing diamond nanograins (not illustrated in FIG. 3A) that become growth nuclei onto the surface 20a is employed. Since diamond has a very high surface free energy, this method of dispersing diamond nanograins as growth nuclei onto the surface 20a of the insulating layer 20 is employed for a material like the insulating layer 20 that hardly allows the crystal growth of diamond. With this method, diamond nanograins as growth nuclei are dispersed and formed onto the surface 20a of the insulating layer 20 with a high surface density, for example, at a surface density higher than $1 \times 10^{12}$ cm$^{-2}$. Diamond grains 43A formed by crystal growth using the diamond nanograins dispersed at such a high surface density as starting material are likely to have a small grain size. Diamond grains 43A of small grain size are likely to be formed at a relatively early stage of the crystal growth, that is, in an area (crystal growth initial layer) relatively close to the substrate 10.

In general, diamond has a physical property of significantly high thermal conductivity. However, as seen in FIG. 4, polycrystalline diamond has a tendency that the thermal conductivity decreases as the grain size of diamond grains forming the polycrystalline diamond decreases.

As illustrated in FIG. 3A, as the grain size of the diamond grains 43A forming the diamond layer 40A decreases, the frequency of scattering phonons, which determine thermal conductivity, in grain boundaries of the diamond grains 43A increases. Because of such scattering in grain boundaries, the thermal conductivity of the diamond layer 40A, more specifically, the thermal conductivity of the crystal growth initial layer where diamond grains 43A of small grain size are likely to be formed decreases. If the diamond grains 43A of small grain size are formed and the thermal conductivity of the diamond layer 40A decreases, as illustrated in FIG. 3A, the following issues may arise. Heat 2 generated by the semiconductor element 11 in the substrate 10 is hard to be transferred efficiently to the diamond layer 40A, and even if the heat 2 is transferred to the diamond layer 40A, the heat 2 is scattered in grain boundaries and so is hard to be diffused or dissipated efficiently. This increases the possibilities of overheating in the substrate 10 and, accordingly, performance deterioration and damage to the semiconductor element 11.

By contrast, as illustrated in FIG. 3B, in a method of providing metal particles 30 on the surface 20a of an insulating layer 20 provided on a substrate 10, diamond nuclei 41, which are growth nuclei for diamond grains 43, are preferentially or selectively formed on the metal particles 30, rather than on the insulating layer 20 (FIG. 2A). Then, diamond grains 43 are formed by crystal growth using the diamond nuclei 41 on the collection of metal particles 30 provided on the surface 20a of the insulating layer 20 as starting material (FIG. 2B), thereby forming a diamond layer 40. The diamond layer 40 has a diamond grain 43 formed by crystal growth, at the location of each of the collection of metal particles 30 on the surface 20a of the insulating layer 20. In this method, the conditions in the formation of the metal particles 30 on the surface 20a of the insulating layer 20, that is, the surface density and particle size of the metal particles 30 are controlled in order to control the surface density of the diamond nuclei 41 on the surface 20a and to control the grain size and quantity of the diamond grains 43 that are formed by crystal growth from the diamond nuclei 41.

For example, the surface density and particle size of the metal particles 30, on which the diamond nuclei 41 are formed, are controlled so that the diamond nuclei 41 on the surface 20a of the insulating layer 20 have a surface density smaller than that of the diamond nanograins dispersed onto the surface 20a as described in the method of FIG. 3A. As an example, the surface density and particle size of the metal particles 30, on which the diamond nuclei 41 are formed, are controlled so that the diamond nuclei 41 have a surface density of $1 \times 10^{12}$ cm$^{-2}$ or less on the surface 20a of the insulating layer 20. As illustrated in FIG. 3B, the control of the surface density and particle size of the metal particles 30 results that the diamond grains 43 formed by crystal growth on the surface 20a of the insulating layer 20 have a gain size larger than that of the diamond grains 43A formed by the method of FIG. 3A.

As seen in the relationship illustrated in FIG. 4, a diamond layer 40 formed of diamond grains 43 with a large grain size tends to have high thermal conductivity. One of considered reasons for this is that, as illustrated in FIG. 3B, when the grain size of diamond grains 43 forming a diamond layer 40 or its crystal growth initial layer increases, the scattering of phonons, which determine thermal conductivity, in grain boundaries of the diamond grains 43 is suppressed. Since the scattering in the grain boundaries of the diamond grains 43 is suppressed, the thermal conductivity of the diamond layer 40 becomes closer to the physical property value of diamond. When the diamond grains 43 have a large grain size and the diamond layer 40 has a high thermal conductivity, as illustrated in FIG. 3B, the following effect is obtained. Heat 2 generated by the semiconductor element 11 in the substrate 10 is transferred efficiently to the diamond layer 40, and the heat 2 transferred to the diamond layer 40 is diffused and dissipated efficiently while scattering of the heat 2 in grain boundaries is suppressed. This results in effectively reducing the possibilities of overheating in the substrate 10 and performance deterioration and damage to the semiconductor element 11 due to the overheating. As a result, the semiconductor device 1 configured as described above has high performance and high quality.

In the method of FIG. 3B, the conditions of the metal particles 30 are controlled so that diamond grains 43 are formed with a relatively large grain size that precludes or minimizes a decrease in the thermal conductivity between the substrate 10 and the insulating layer 20 due to the grain size of the diamond grains 43 in the diamond layer 40 or its crystal growth initial layer. More specifically, the surface density and particle size of the metal particles 30, on which the diamond nuclei 41 are formed, are controlled so that diamond grains 43 are formed with a relatively large grain size and a relatively high thermal conductivity.

The following describes the surface density and particle size of metal particles 30.

Figure 5A:
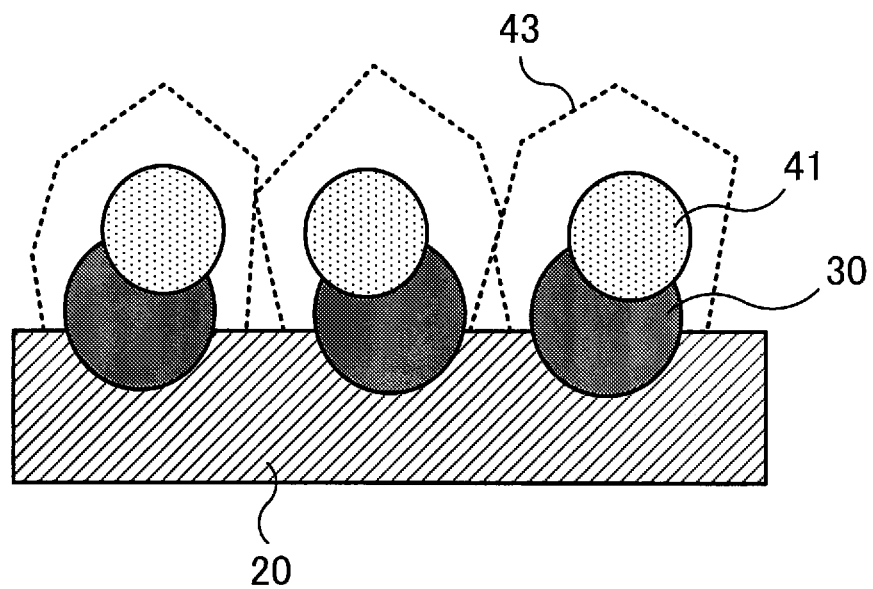
FIGS. 5A and 5B are views for explaining the surface density of metal particles.
Figure 5B:
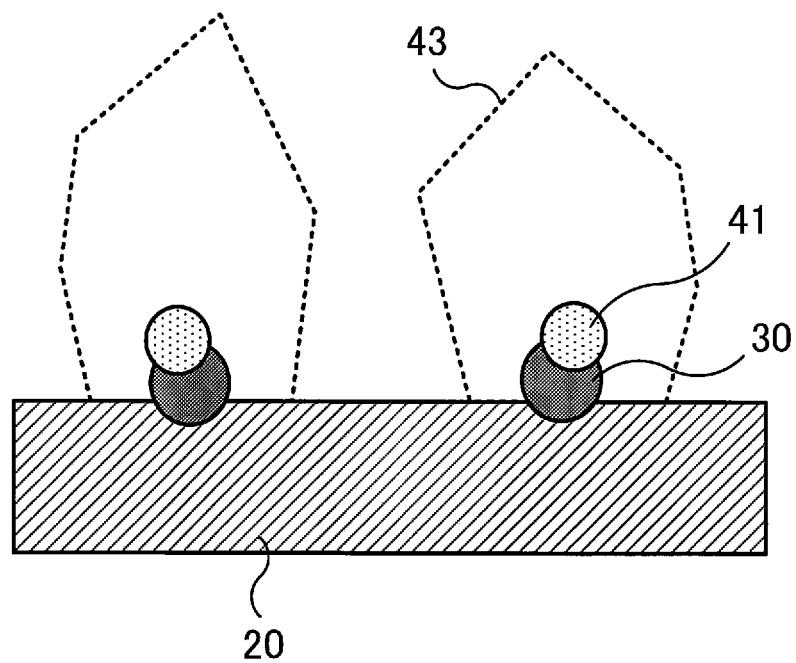
Figure 6A:
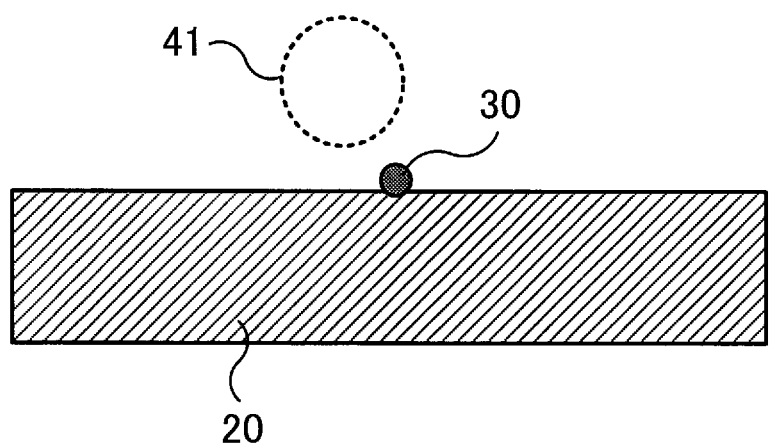
FIGS. 6A and 6B are views for explaining the particle size of metal particles.
Figure 6B:
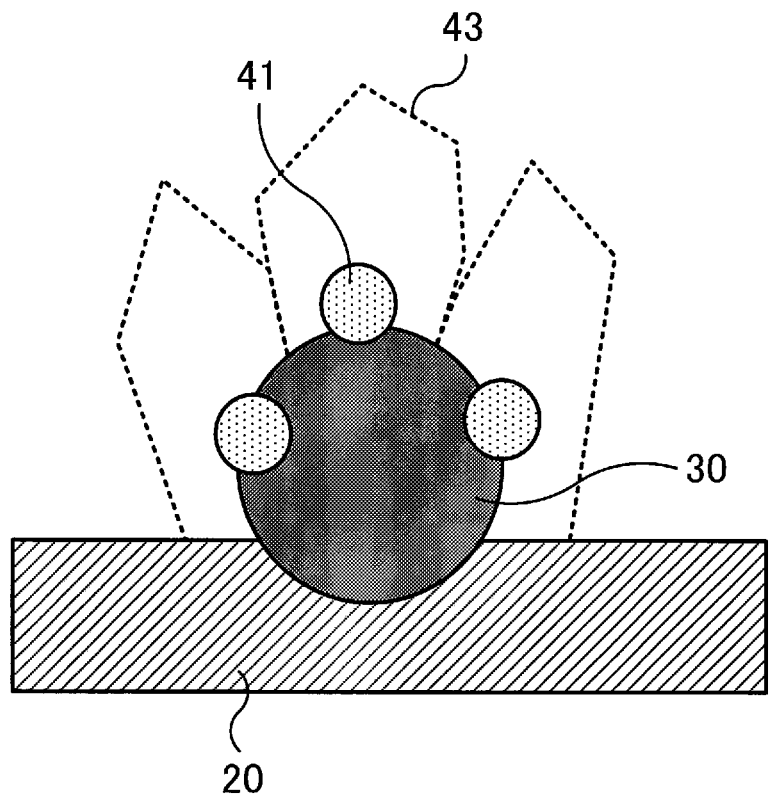

FIGS. 5A and 5B are views for explaining the surface density of metal particles. FIG. 5A is a cross-sectional view schematically illustrating a main part of an example of a case where metal particles have a relatively high surface density. FIG. 5B is a cross-sectional view schematically illustrating a main part of an example of a case where metal particles have a relatively low surface density. In addition, FIGS. 6A and 6B are views for explaining the particle size of metal particles. FIG. 6A is a cross-sectional view schematically illustrating a main part of an example of a case where a metal particle has a relatively small particle size. FIG. 6B is a cross-sectional view schematically illustrating a main part of an example of a case where a metal particle has a relatively large particle size.

First, the surface density of metal particles 30 will be described.

To dissipate heat 2 generated in a substrate 10 using a diamond layer 40, the diamond layer 40 or its crystal growth initial layer needs to have a thermal conductivity higher than that of an insulating layer 20 provided between the substrate 10 and the diamond layer 40. On the basis of the heat conductivity of an insulating material used for the insulating layer 20 and results of simulating the thermal conductivity between the insulating layer 20 and the crystal growth initial layer of the diamond layer 40, it has been found that when the crystal growth initial layer has a thermal conductivity higher than 10 W/m·K, a certain level or higher of heat dissipation effect is obtained. For example, as seen in FIG. 4, the diamond layer 40 has a thermal conductivity of about 20 W/m·K, higher than 10 W/m·K, when diamond grains 43 have a grain size of 10 nm or more. To form diamond grains 43 with a grain size of 10 nm or more on the surface 20a of the insulating layer 20, a distance between adjacent ones of diamond nuclei 41, which are starting material for crystal growth, needs to be 10 nm or more. By converting these conditions into the surface density of the diamond nuclei 41 on the surface 20a of the insulating layer 20, a surface density of $1\times10^{12}$ cm$^{-2}$ or less is obtained. Considering that one diamond nucleus 41 is formed on one metal particle 30 and then diamond grains 43 are formed by crystal growth using the diamond nuclei 41 as starting material (FIG. 2A), the surface density of the diamond nuclei 41 is equal to that of the metal particles 30. Therefore, in order to form the diamond grains 43 with a grain size of 10 nm or more, the surface density of the metal particles 30 on the surface 20a of the insulating layer 20 is set to $1\times10^{12}$ cm$^{-2}$ or less.

Assuming now that the surface density of the metal particles 30 on the surface 20a of the insulating layer 20 is set high (higher than $1\times10^{12}$ cm$^{-2}$ in this example), the surface density of generated diamond nuclei 41 becomes high, as illustrated in FIG. 5A. If the surface density of the diamond nuclei 41 is high, diamond grains 43, which are grown from the diamond nuclei 41 by crystal growth, have a small grain size (less than 10 nm in this example). That is to say, this case is similar to the case using the method of FIG. 3A, i.e., the case where diamond grains 43A with a small grain size are formed by crystal growth from diamond nanograins dispersed onto the surface 20a of the insulating layer 20. As a result, it may be impossible to produce a diamond layer 40 or its crystal growth initial layer with a certain level (20 W/m·K in this case) or higher of thermal conductivity.

In addition, for example, in order to form a diamond layer 40 with a constant thickness of 100 μm, diamond grains 43 need to have a grain size of 100 μm or less, and a distance between adjacent ones of diamond nuclei 41, which are starting material for crystal growth, needs to be 100 μm or less. By converting these conditions into the surface density of the diamond nuclei 41 on the surface 20a of the insulating layer 20, a surface density of $1\times10^{4}$ cm$^{-2}$ or more is obtained. As described above, considering that one diamond nucleus 41 is formed on one metal particle 30 and then diamond grains 43 are formed by crystal growth using the diamond nuclei as starting material, the surface density of the diamond nuclei 41 is equal to that of the metal particles 30. Therefore, in order to form diamond grains 43 with a grain size of 100 μm or less, the surface density of the metal particles 30 on the surface 20a of the insulating layer 20 is set to $1\times10^{4}$ cm$^{-2}$ or more.

Assuming now that the surface density of the metal particles 30 on the surface 20a of the insulating layer 20 is set low (less than $1\times10^{4}$ cm$^{-2}$ in this example), the surface density of generated diamond nuclei 41 becomes low, as illustrated in FIG. 5B. If the surface density of the diamond nuclei 41 is low, the surface density of diamond grains 43 grown from the diamond nuclei 41 by crystal growth may become low accordingly, and no adjacent diamond grains 43 may be coalesced, thereby failing to obtain a continuous diamond layer 40.

In view of the above, the surface density of metal particles 30 is set in a range between $1\times10^{4}$ cm$^{-2}$ and $1\times10^{12}$ cm$^{-2}$, inclusive, for example.

The following describes the particle size of metal particles 30.

It is known that diamond nuclei are not stable on metal with a particle size of 2 nm or less (see Science, Volume 287, p. 104 to 106). For example, diamond nuclei 41, which are starting material for crystal growth of the diamond layer 40, are not formed on metal particles 30 with a particle size of 2 nm or less. Therefore, the particle size of the metal particles 30 provided on the surface 20a of the insulating layer 20 is set to 2 nm or more.

In addition, if the particle size of metal particles 30 increases, a plurality of diamond nuclei 41 are more likely to be formed on one metal particle 30. For example, if a plurality of diamond nuclei 41 are formed on one metal particle 30, as illustrated in FIG. 6B, the surface density of the diamond nuclei 41 on the surface 20a of the insulating layer 20 becomes high, and therefore diamond grains 43 with a small grain size are grown from the diamond nuclei 41 by crystal growth. As a result, it may be impossible to produce a diamond layer 40 or its crystal growth initial layer with a certain level or higher of thermal conductivity. The diamond nuclei 41 are formed with a surface density of $1\times10^{8}$ cm$^{-2}$ or more on metal. Therefore, to form one diamond nucleus 41 on one metal particle 30, the particle size of the metal particles 30 is set to 1 μm or less.

In view of the above, the particle size of metal particles 30 is set in a range between 2 nm and 1 μm, inclusive, for example.

In this connection, the ranges for the surface density and particle size of metal particles 30 have been described above by way of example, and are not limited to the above ranges. For example, on the basis of the amount of heat generated by the semiconductor element 11 or the substrate 10 with the semiconductor element 11, the thermal conductivity of the diamond layer 40 is determined, the grain size of the diamond grains 43 is determined, and then based on this, the surface density of the diamond nuclei 41 is determined. Alternatively, on the basis of the thickness of the diamond layer 40 to be formed over the substrate 10, the grain size of diamond grains 43 is determined, and based on this, the surface density of the diamond nuclei 41 is determined. Then, on the basis of a determined surface density of the diamond nuclei 41, a range for the surface density of metal particles 30 is determined. Alternatively, the ranges for the metal particles 30 are determined on the basis of the following factors: easiness of formation of diamond nuclei 41 with respect to a metal material to be used for the metal particles 30, easiness of formation of diamond nuclei 41 on the insulating layer 20, conditions for forming diamond nuclei 41, or others.

As described above, in the semiconductor device 1, an insulating layer 20 is provided on a substrate 10 including a semiconductor element 11, and metal particles 30 are formed on the surface 20a of the insulating layer 20 using metal materials such as Ni and Ir that allow relatively easy formation of diamond nuclei 41. The diamond nuclei 41 are mainly formed on the metal particles 30 among the surface 20a of the insulating layer 20 and the metal particles 30 provided on the surface 20a. By controlling the surface density and particle size of the metal particles 30 on the surface 20a of the insulating layer 20, the surface density of the diamond nuclei 41 that are formed on the surface 20a of the insulating layer 20 is controlled. Then, diamond grains 43 are formed by crystal growth using the diamond nuclei 41, formed with the controlled surface density on the surface 20a of the insulating layer 20, as starting material, thereby forming a polycrystalline diamond layer 40. The control of the surface density of the diamond nuclei 41 results in forming the diamond grains 43 with a relatively large grain size around the interface between the diamond layer 40 and the insulating layer 20, i.e., in the crystal growth initial layer of the diamond layer 40. This approach effectively precludes a decrease in the thermal conductivity between the substrate 10 and the insulating layer 20 due to the grain size in the diamond layer 40, and improves the thermal conductivity between the diamond layer 40 and the substrate 10.

According to the semiconductor device 1 configured as described above, heat 2 generated by the semiconductor element 11 is transferred efficiently from the substrate 10 to the diamond layer 40, and is then dissipated efficiently from the diamond layer 40 to the outside. This effectively reduces the possibilities of overheating in the substrate 10 and performance deterioration and damage to the semiconductor element 11 due to the overheating. As a result, the semiconductor device 1 configured as described above has high performance and high quality.

Second Embodiment

A second embodiment describes an example where a technique described in the first embodiment is applied to an HEMT, which is a type of semiconductor device using a nitride semiconductor.

Nitride semiconductors, having high saturated electron velocity, large band gap, and other features, are expected to be applied to semiconductor devices with high breakdown voltage and high output characteristics. For example, GaN, which is one of nitride semiconductors, has a band gap energy of 3.4 eV, higher than the Si band gap energy of 1.1 eV and the GaAs band gap energy of 1.4 eV, and has a high breakdown field strength. Therefore, GaN is a promising material for semiconductor devices for power supply and others that perform high-voltage operation and achieve high output, for example. A HEMT using a GaN-based nitride semiconductor is known as a type of semiconductor device using a nitride semiconductor.

Figure 7:
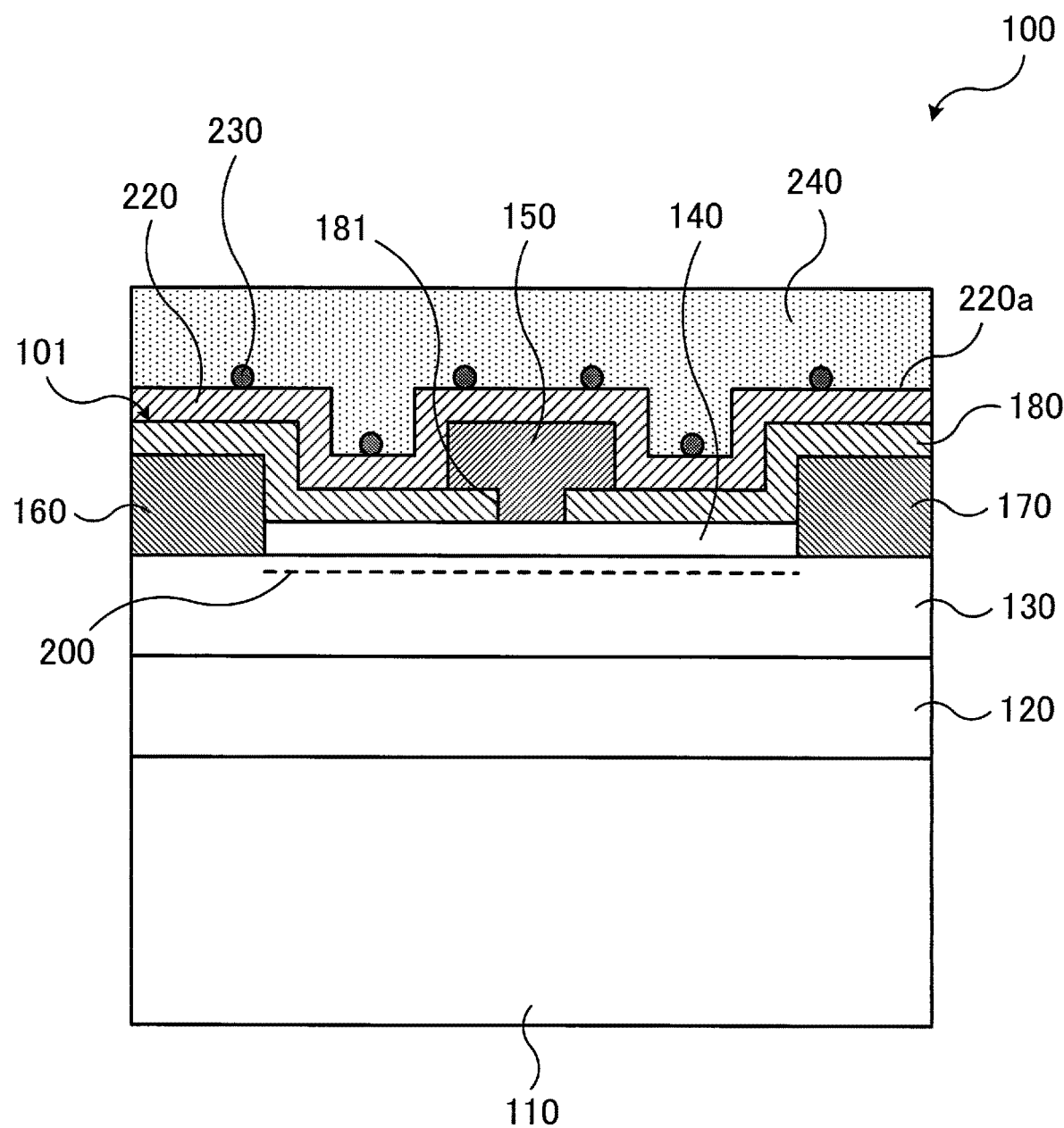
FIG. 7 is a view for explaining an example of a semiconductor device according to a second embodiment.

FIG. 7 is a view for explaining an example of a semiconductor device according to the second embodiment. FIG. 7 is a cross-sectional view schematically illustrating a main part of the example semiconductor device.

The semiconductor device 100 illustrated in FIG. 7 is an example of the above-mentioned HEMT. This semiconductor device 100 has a structure 101 including a substrate 110, a buffer layer 120, a channel layer 130, a barrier layer 140, a gate electrode 150, a source electrode 160, and a drain electrode 170. This structure 101 may include an insulating layer 180. The semiconductor device 100 further includes an insulating layer 220, metal particles 230, and a diamond layer 240 on the structure 101.

For example, a Si substrate is used as the substrate 110. Other than this, a SiC substrate, a sapphire substrate, a GaN substrate, or another may be used as the substrate 110.

The buffer layer 120 is provided on the substrate 110. A nitride semiconductor, for example, aluminum gallium nitride (AlGaN) is used for the buffer layer 120. For example, the buffer layer 120 is formed using AlGaN on an aluminum nitride (AlN) layer (not illustrated) provided as an initial layer on the substrate 110. The buffer layer 120 (and its initial layer) is formed on the substrate 110 by metal organic chemical vapor deposition (MOCVD), metal organic vapor phase epitaxy (MOVPE), or molecular beam epitaxy (MBE).

The channel layer 130 is provided on the buffer layer 120. A nitride semiconductor, for example, GaN is used for the channel layer 130. Other than this, there are other candidate nitride semiconductors for the channel layer 130, including, but not limited to, indium gallium nitride (InGaN), AlGaN, and indium aluminum gallium nitride (InAlGaN). The channel layer 130 may be formed to have a single-layer structure with one type of nitride semiconductor or a multilayer structure with one type of nitride semiconductor or two or more types of nitride semiconductors. An undoped nitride semiconductor is used for the channel layer 130, for example. The channel layer 130 is formed on the buffer layer 120 by MOVPE or MBE. The channel layer 130 is also called an electron transport layer.

The barrier layer 140 is provided on the channel layer 130. A nitride semiconductor, for example, AlGaN is used for the barrier layer 140. Other than this, there are other candidate nitride semiconductors for the barrier layer 140, including, but not limited to, indium aluminum nitride (InAlN), InAlGaN, and AlN. The barrier layer 140 may be formed to have a single-layer structure with one type of nitride semiconductor or a multilayer structure with one type of nitride semiconductor or two or more types of nitride semiconductors. For example, an undoped nitride semiconductor is used for the barrier layer 140. The barrier layer 140 is formed on the channel layer 130 by MOVPE or MBE. The barrier layer 140 is also called an electron supply layer.

In this connection, nitride semiconductors having different band gaps are used for the channel layer 130 and the barrier layer 140. By forming the barrier layer 140 of a nitride semiconductor with a larger band gap than the channel layer 130 on the channel layer 130, a heterojunction structure having a band discontinuity is formed. By pinning the fermi level above the conduction band at the contact interface between the channel layer 130 and the barrier layer 140 (i.e., at a higher energy), a two-dimensional electron gas (2DEG) 200 is generated at the contact interface in the channel layer 130. By providing the barrier layer 140 of a nitride semiconductor with a larger lattice constant than the channel layer 130 on the channel layer 130, piezo polarization occurs in the barrier layer 140. Due to spontaneous polarization in the nitride semiconductor used for the barrier layer 140 and piezo polarization occurring due to the lattice constant of the barrier layer 140, high-concentration 2DEG 200 is generated at the contact interface in the channel layer 130. A combination of nitride semiconductors that generate such 2DEG 200 in the vicinity of the contact interface between the channel layer 130 and the barrier layer 140 is used for the channel layer 130 and the barrier layer 140.

The gate electrode 150 is provided on the barrier layer 140, for example. The gate electrode 150 and the barrier layer 140 may have therebetween a cap layer such as a GaN cap layer, or a protective film of oxide, nitride, oxynitride, or another. The gate electrode 150 functions as a Schottky electrode or a Schottky gate electrode. Metal materials are used for the gate electrode 150. For example, the gate electrode 150 is a metal electrode of Ni and Au formed on Ni. The gate electrode 150 is formed by an evaporation method or another method.

The source electrode 160 and drain electrode 170 are provided on the channel layer 130, penetrating the barrier layer 140, and sandwich the gate electrode 150 therebetween, for example. The source electrode 160 and drain electrode 170 function as ohmic electrodes. The source electrode 160 and drain electrode 170 may be provided on the barrier layer 140 as long as they function as ohmic electrodes. Metal materials are used for the source electrode 160 and drain electrode 170. For example, the source electrode 160 and drain electrode 170 are metal electrodes of tantalum (Ta) and aluminum (Al) formed on Ta. The source electrode 160 and drain electrode 170 are formed by an evaporation method or another method.

The insulating layer 180 is provided on the barrier layer 140, source electrode 160, and drain electrode 170. The insulating layer 180 has an opening 181 reaching the barrier layer 140 so that the gate electrode 150 and the barrier layer 140 contact each other in the opening 181 (via a cap layer or the like if it is interposed therebetween). The insulating layer 180 functions as a passivation film. SiN is used for the insulating layer 180, for example. Other than this, there are other candidate materials for the insulating layer 180, including oxide, nitride, and oxynitride containing one type or two or more types selected from Si, Al, hafnium (Hf), zirconium (Zr), titanium (Ti), Ta, and W. The insulating layer 180 is formed by plasma-enhanced CVD or another method.

In the semiconductor device 100, the function of HEMT is implemented by the structure 101 including the above substrate 110, buffer layer 120, channel layer 130, barrier layer 140, gate electrode 150, source electrode 160, drain electrode 170, and insulating layer 180. For example, the structure 101 configured as described above is used as the substrate 10 described in the first embodiment or as part (including the semiconductor element 11) of the substrate 10.

The insulating layer 220 is provided on the above structure 101 (substrate), for example. SiN is used for the insulating layer 220, for example. Other than this, there are other candidate materials for the insulating layer 220, including, but not limited to, SiO, SiON, SiC, and SiOC. An insulating material that allows formation of metal particles 230 using metal materials to be described later is selected for the insulating layer 220. The insulating layer 220 is provided in such a manner as to cover the structure 101, for example. The insulating layer 220 is formed by plasma-enhanced CVD or another method.

A plurality of metal particles 230 are provided in such a manner as to be exposed on the surface 220a of the insulating layer 220. Each metal particle 230 may be provided on the surface 220a of the insulating layer 220. As long as part of a metal particle 230 is exposed on the surface 220a, the remaining part of the metal particle 230 may be embedded inside the insulating layer 220. For the metal particles 230, at least one type of metal material that allows formation of growth nuclei for the diamond layer 240 is selected. As will be described later, the growth nuclei grow by crystal growth to form the diamond layer 240. For example, Ni is used for the metal particles 230. In place of or in addition to Ni, one type or two or more types selected from Ir, Pt, Mo, W, Cu, and Au may be used for the metal particles 230. Metal particles 230 containing two or more types of metal materials may be in the form of an alloy, solid solution, eutectic, intermetallic compound, or another. The metal particles 230 exposed on the surface 220a of the insulating layer 220 have a prescribed surface density and prescribed particle size, for example. The "surface density" here refers to the density of a collection of metal particles 230 on the surface 220a of the insulating layer 220. The "particle size" here refers to the particle size (diameter) of each metal particle 230 or the average particle size (diameter) of the collection of metal particles 230.

The diamond layer 240 is provided on the surface 220a of the insulating layer 220 on which the metal particles 230 are exposed. The diamond layer 240 is used as an insulating part (interlayer insulating film or the like) in the wiring layer provided on the structure 101. The high thermal conductivity property of diamond enables the diamond layer 240 to function as a heat dissipating member that dissipates heat generated by the structure 101 having the function of HEMT during its operation to the outside. For example, the diamond layer 240 is formed by crystal growth on the surface 220a of the insulating layer 220 using hot-filament CVD or plasma-enhanced CVD.

In the semiconductor device 100 configured as described above, the diamond layer 240 is provided over the structure 101, so that heat generated in the structure 101 is transferred efficiently to the diamond layer 240 and is then dissipated efficiently from the diamond layer 240 to the outside. This reduces the possibilities of overheating in the structure 101 and performance deterioration and damage to the structure 101, i.e., the HEMT due to the overheating.

In the semiconductor device 100, for the crystal growth of the diamond layer 240, metal particles 230 are formed with a prescribed surface density and particle size on the surface 220a of the insulating layer 220, in order to control the surface density of growth nuclei and to control the grain size and quantity of crystal grains that are grown using the growth nuclei as starting material. This makes it possible to form the diamond layer 240 with a high thermal conductivity and accordingly to improve the thermal conductivity between the structure 101 and the diamond layer 240, which in turn more effectively reduces the possibilities of overheating in the structure 101 and performance deterioration and damage to the HEMT due to the overheating. As a result, the semiconductor device 100 configured as described above has high performance and high quality.

The following describes how to manufacture a semiconductor device 100 having the above-described configuration, with reference to FIGS. 8A to 12B.

FIGS. 8A to 8C and 9A to 9C are views for explaining an example of how to manufacture a semiconductor device according to the second embodiment. FIGS. 8A to 8C and 9A to 9C are each a cross-sectional view schematically illustrating a main part of the example process of manufacturing a semiconductor device.

Figure 8A:
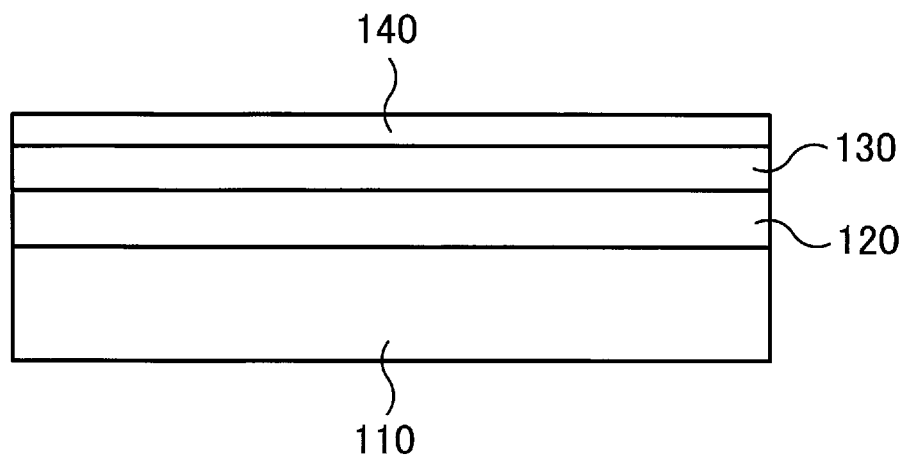
FIGS. 8A to 8C are views for explaining an example of how to manufacture a semiconductor device according to the second embodiment (part 1)

For example, in manufacturing a semiconductor device 100, first, an initial layer (not illustrated) and buffer layer 120, a channel layer 130, and a barrier layer 140 are formed in this order in stack on a substrate 110 by crystal growth using MOVPE, as illustrated in FIG. 8A. For example, a Si substrate is used as the substrate 110, AlN with a thickness of 160 nm is formed as the initial layer on the substrate 110 by crystal growth, and AlGaN is formed as the buffer layer 120 on the initial layer by crystal growth. For example, the buffer layer 120 is formed by crystal growth in $Al_xGa_{1-x}N$ (0.2<x<0.8) multilayer structure with an entire thickness of approximately 500 nm. Here, the Al composition x is in a range between 0.2 and 0.8. Then, GaN with a thickness of about 1 µm is formed as the channel layer 130 on the buffer layer 120 by crystal growth, and AlGaN is formed as the barrier layer 140 by crystal growth. For example, the barrier layer 140 is formed by crystal growth in $Al_{0.2}Ga_{0.8}N$ structure with a thickness of 20 nm. Here, the Al composition x is 0.2.

With regard to the crystal growth of each layer by MOVPE, a mixed gas of Tri-Methyl-Aluminum (TMAl), which is a source of Al, and ammonia ($NH_3$) is used for the crystal growth of AlN. A mixed gas of Tri-Methyl-Gallium (TMGa), which is a source of Gallium (Ga), and $NH_3$ is used for the crystal growth of GaN. A mixed gas of TMAl, TMGa, and $NH_3$ is used for the crystal growth of AlGaN. The supply and supply stop (switching) of each of TMAl and TMGa and the flow rate thereof at supply (mixing ratio with the other material) are appropriately determined according to a nitride semiconductor that is to be grown by crystal growth. The flow rate of $NH_3$ that is common material to AlN, GaN, and AlGaN is set to about 100 ml/m to 10 L/m. The crystal growth pressure is set to about 50 Torr to 300 Torr (1 Torr≈133.322 Pa), and the crystal growth temperature is set to about 1000° C. to 2000° C.

In the manner described above, the initial layer (not illustrated) and buffer layer 120, channel layer 130, and barrier layer 140 are formed in this order by crystal growth, so that a multi-layer structure is formed.

Figure 8B:
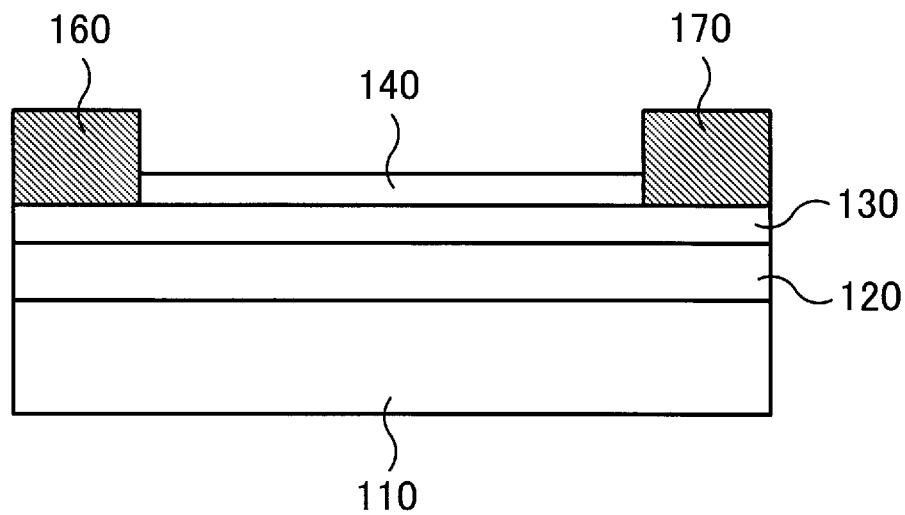

After each layer is formed by crystal growth, part of the barrier layer 140 is removed, and the source electrode 160 and drain electrode 170 that are connected to the channel layer 130 are formed, as illustrated in FIG. 8B. To this end, first, the barrier layer 140 is removed from areas where the source electrode 160 and drain electrode 170 are to be formed, using photolithography and etching techniques. Then, an electrode metal, for example, a laminate of layers of Ta and Al is formed on each area of the channel layer 130 corresponding to the removed areas of the barrier layer 140 for forming the source electrode 160 and drain electrode 170, using photolithography, evaporation, and lift-off techniques. After that, for example, a heat treatment is carried out under an inert gas atmosphere of nitrogen ($N_2$) or the like, so that the electrode metals form an ohmic contact. Thereby, the source electrode 160 and drain electrode 170 that function as ohmic electrodes are formed on the channel layer 130.

Figure 8C:
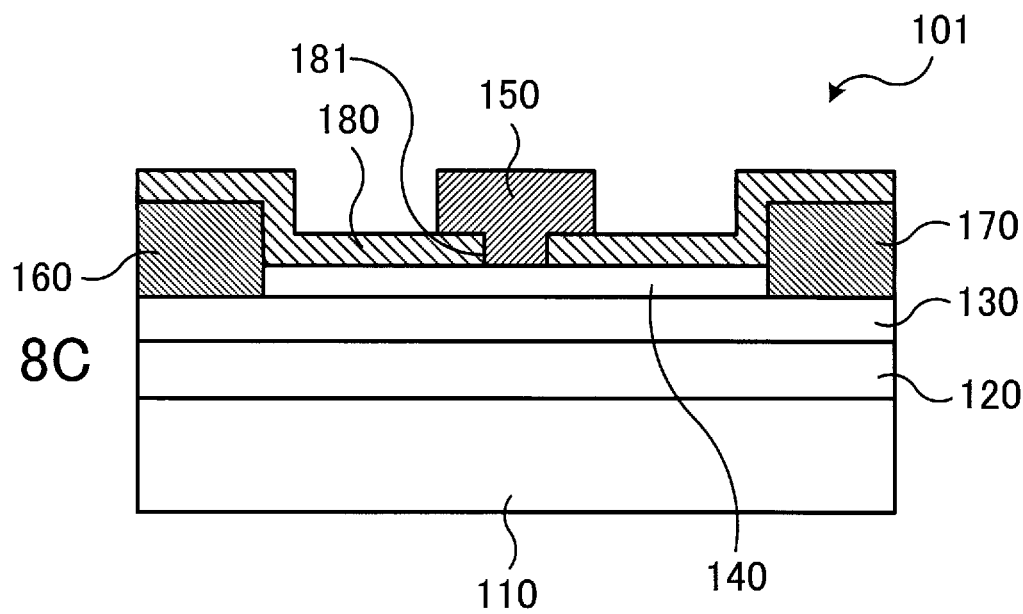

After the source electrode 160 and drain electrode 170 are formed, the insulating layer 180 and gate electrode 150 are formed, as illustrated in FIG. 8C. To this end, first, the insulating layer 180 is formed in such a manner as to cover the barrier layer 140, source electrode 160, and drain electrode 170 using plasma-enhanced CVD. For example, SiN is formed as the insulating layer 180. Then, an opening 181 is formed in an area of the insulating layer 180 where the gate electrode 150 is to be formed, using photolithography and etching techniques. After that, an electrode metal, for example, a laminate of layers of Ni and Au is formed using photolithography, evaporation, and lift-off techniques, so that the gate electrode 150 is formed.

In the manner described above, the gate electrode 150 is formed on an opposite side of the barrier layer 140 from the channel layer 130. In addition, the source electrode 160 and drain electrode 170 are formed on the same side of the channel layer 130 as the gate electrode 150 and sandwich the gate electrode 150 therebetween.

For example, the structure 101 having the function of HEMT is formed by the process of FIGS. 8A to 8C.

The above example uses a single-layer GaN for the channel layer 130 and a single-layer AlGaN for the barrier layer 140. However, the structures of the channel layer 130 and barrier layer 140 are not limited to this example. For example, the channel layer 130 may be formed of a nitride semiconductor such as InGaN, AlGaN, or InAlGaN, and may be formed in a single-layer structure of one type of nitride semiconductor or a multi-layer structure of one type of nitride semiconductor or two or more types of nitride semiconductors. In addition, the barrier layer 140 may be formed of a nitride semiconductor such as InAlN, InAlGaN, or AlN, and may be formed in a single-layer structure of one type of nitride semiconductor or a multi-layer structure formed of one type of nitride semiconductor or two or more types of nitride semiconductors.

In the case of forming a cap layer on the barrier layer 140, a GaN layer may be formed in such a manner as to cover the barrier layer 140, for example. This protects the barrier layer 140. In addition, as the cap layer, a GaN (p-type GaN) layer containing p-type impurity or a InGaN layer may be provided directly under the gate electrode 150. The p-type GaN layer directly under the gate electrode 150 increases the conduction band at the contact interface between the channel layer 130 and the barrier layer 140 below the gate electrode 150 because of its fixed charge, thereby suppressing the generation of 2DEG 200. The InGaN layer directly under the gate electrode 150 increases the conduction band at the contact interface between the channel layer 130 and the barrier layer 140 below the gate electrode 150 because of piezo polarization occurring therein, thereby suppressing the generation of 2DEG 200. The p-type GaN layer or InGaN layer directly under the gate electrode 150 achieves a so-called normally-off HEMT, which interrupts current flowing between the source electrode 160 and drain electrode 170 when gate voltage is off.

In addition, the types of metal materials to be used for the gate electrode 150, source electrode 160, and drain electrode 170 and their layer structures are not limited to the above example, and the method of forming them is also not limited to the above example. Each of the gate electrode 150, source electrode 160, and drain electrode 170 may be formed in a single-layer structure or a multilayer structure. The above-described heat treatment is not always needed in forming the source electrode 160 and drain electrode 170 as long as an ohmic contact is made by forming their electrode metals. To form the gate electrode 150, a heat treatment may additionally be carried out after its electrode metal is formed.

In addition, an asymmetric structure may be employed, in which the gate electrode 150 is disposed closer to the source electrode 160 or the source electrode 160 is disposed closer to the gate electrode 150, in order to relax the electric field between the gate electrode 150 and the drain electrode 170 and to improve the breakdown voltage characteristics.

The above has described an example of using a Si substrate as the substrate 110. Alternatively, another substrate material may be used as long as a nitride semiconductor is used for a structural part having the function of a field effect transistor. The substrate 110 may have a semi-insulating property or a conductive property. Other than a Si substrate, a semi-insulating SiC substrate, conductive SiC substrate, sapphire substrate, GaN substrate, diamond substrate, or another may be used for the substrate 110.

After the structure 101 is formed, an insulating layer 220 and a metal layer 231 are formed on the structure 101, as illustrated in FIG. 9A. To this end, first, the insulating layer 220 is formed by plasma-enhanced CVD in such a manner as to cover the insulating layer 180 and gate electrode 150 of the structure 101. For example, SiN with a thickness of 100 nm is formed as the insulating layer 220. After that, the metal layer 231 is formed on the insulating layer 220 using evaporation technique or spattering technique. For example, Ni with a thickness of 2 nm to 100 nm is formed as the metal layer 231.

After the metal layer 231 is formed, a heat treatment is carried out. For example, the heat treatment is carried out at a temperature of 600° C. to 1200° C. under an inert gas atmosphere or a reducing gas atmosphere. This heat treatment causes aggregation of the metal material used for the metal layer 231, that is, Ni in this example, so that a plurality of metal particles 230 are formed on the insulating layer 220, as illustrated in FIG. 9B.

Figure 10A:
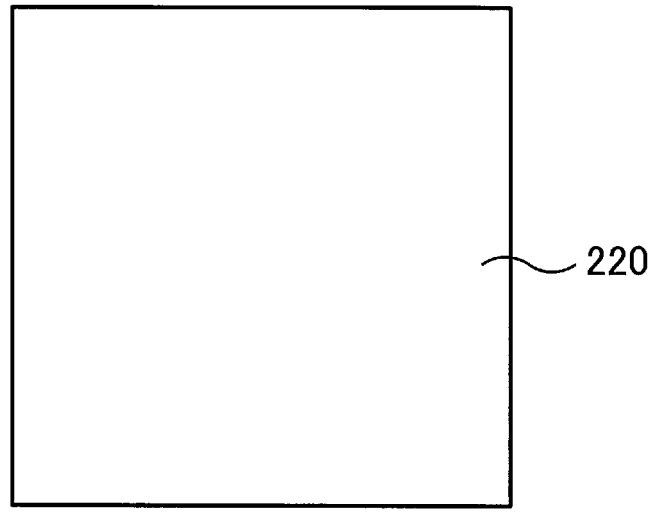
FIGS. 10A to 10C are views for explaining how to form metal particles.
Figure 10B:
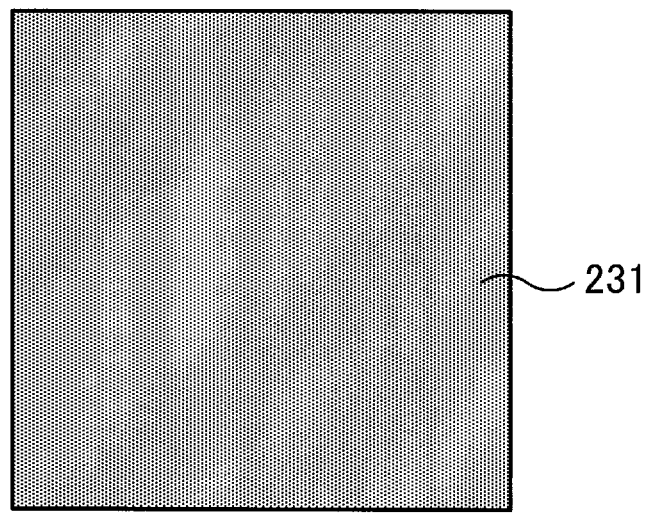
Figure 10C:
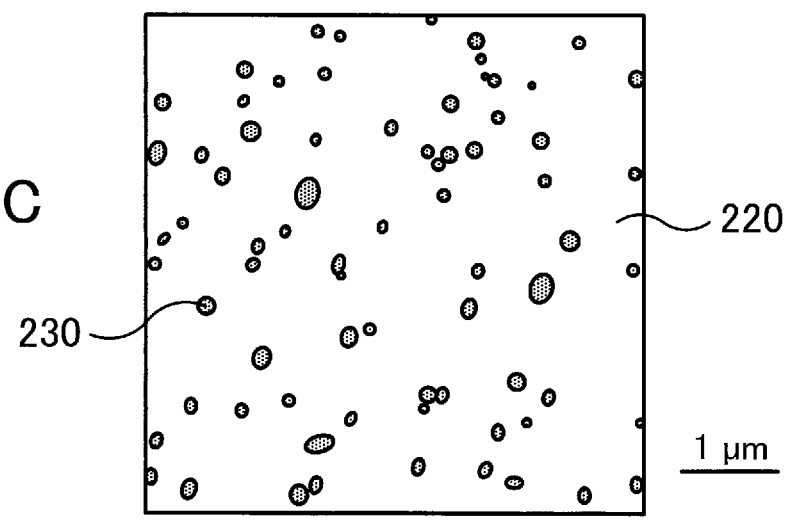

FIGS. 10A to 10C are views for explaining how to form metal particles.

FIG. 10A is a view of an atomic force microscope (AFM) image of an insulating layer 220 before a metal layer 231 is formed in the process of FIG. 9A. FIG. 10B is a view of an AFM image of the metal layer 231 formed on the insulating layer 220 in the process of FIG. 9A. FIG. 10C is a view of an AFM image after a heat treatment of the metal layer 231 is carried out in the process of FIG. 9B.

A Ni metal layer 231 is formed in such a manner as to cover a SiN insulating layer 220 illustrated in FIG. 10A, as illustrated in FIG. 10B (FIG. 9A). Then, a heat treatment is carried out at a temperature of 800° C. for one hour under an inert gas atmosphere in this state where the Ni metal layer 231 is formed on the SiN insulating layer 220. This heat treatment causes aggregation of Ni in the metal layer 231, so that Ni particles with a particle size of 1 µm or less, that is, metal particles 230 are formed on the insulating layer 220 as illustrated in FIG. 10C (FIG. 9B).

The particle size and surface density of the metal particles 230 are controlled by controlling the thickness of the metal layer 231 that is formed on the insulating layer 220, the temperature, duration, and atmosphere of the heat treatment, and others. For example, if a thicker metal layer 231 is formed on the insulating layer 220, metal particles 230 with a relatively large particle size are more likely to be formed. If the heat treatment is carried out at a higher temperature or for a longer period of time, or both at a higher temperature and for a longer period of time, metal particles 230 with a relatively large particle size are more likely to be formed. If an atmosphere that is more likely to cause aggregation of metal is selected, metal particles 230 with a relatively large particle size are obtained. By controlling the thickness of the metal layer 231 that is formed on the insulating layer 220, the temperature, duration, and atmosphere of the heat treatment, and others in the process of FIGS. 9A and 9B, a state is obtained in which metal particles 230 formed on the insulating layer 220 have a prescribed surface density and particle size.

Assume now that a diamond layer 240 with a thermal conductivity of 20 W/m·K or more is to be formed. In order to form diamond grains (FIG. 4) with a grain size of 10 nm or more that satisfy the thermal conductivity, a distance between adjacent ones of diamond nuclei that are starting material for crystal growth is 10 nm or more. By converting these conditions into the surface density on the insulating layer 220, a surface density of $1 \times 10^{12}$ cm$^{-2}$ or less is obtained. Considering that one diamond nucleus is formed on one metal particle 230, the surface density of metal particles 230 on the insulating layer 220 is set to $1 \times 10^{12}$ cm$^{-2}$ or less. In addition, in order to form a diamond layer 240 with a thickness of 100 µm, the grain size of the diamond grains is 100 µm or less, and a distance between adjacent ones of diamond nuclei, which are starting material for crystal growth, is 100 µm or less. By converting these conditions into the surface density on the insulating layer 220, a surface density of $1 \times 10^4$ cm$^{-2}$ or more is obtained. Considering that one diamond nucleus is formed on one metal particle 230, the surface density of metal particles 230 on the insulating layer 220 is set to $1 \times 10^4$ cm$^{-2}$ or more. In view of these, the surface density of metal particles 230 is set in a range between $1 \times 10^4$ cm$^{-2}$ and $1 \times 10^{12}$ cm$^{-2}$, inclusive, for example.

In addition, diamond nuclei are stable on metal particles 230 when the metal particles 230 have a particle size of 2 nm or more, and one diamond nucleus is formed on one metal particle 230 when the metal particles 230 have a particle size of 1 µm or less. In view of these, the particle size of the metal particles 230 is set in a range between 2 nm and 1 µm, inclusive, for example.

For example, the thickness of the metal layer 231, the temperature, duration, and atmosphere of the heat treatment, and others are controlled so that the metal particles 230 are formed with the above surface density and particle size on the insulating layer 220 after the heat treatment of the metal layer 231 on the insulating layer 220.

After the metal particles 230 are formed, a diamond layer 240 is formed on the surface 220a of the insulating layer 220 having the metal particles 230 formed thereon, as illustrated in FIG. 9C. The diamond layer 240 is formed by crystal growth on the surface 220a of the insulating layer 220 using hot-filament CVD or plasma-enhanced CVD. For example, in the crystal growth of the diamond layer 240 using the hot-filament CVD, a mixed gas of $CH_4$ and $H_2$ is used as a source gas. In this connection, oxygen ($O_2$), $N_2$, and others may be used depending on the conditions of the crystal growth and the like. The concentration of $CH_4$ to $H_2$ is set to about 0.05% to 10%. The crystal growth pressure is set to about 0.5 kPa to 100 kPa, and the crystal growth temperature is set to about 350° C. to 1200° C.

To form growth nuclei (diamond nuclei) on the metal particles 230 in the formation of the diamond layer 240, the following method is employed. For carbonization of the metal particles 230, diamond grains are added onto the metal particles 230 with an infiltration method, and are heated under a mixed gas atmosphere of $CH_4$ and $H_2$ and at high temperature, for example, at a temperature of about 1000° C. After the heating, crystal growth is promoted to form the diamond layer 240 under a lower temperature environment, for example, at a temperature of about 800° C. and with the above conditions of crystal growth. For forming diamond nuclei on the metal particles 230, bias-enhanced nucleation may be employed.

FIGS. 11A, 11B, 12A, and 12B are views for explaining how to form a diamond layer.

Figure 11A:
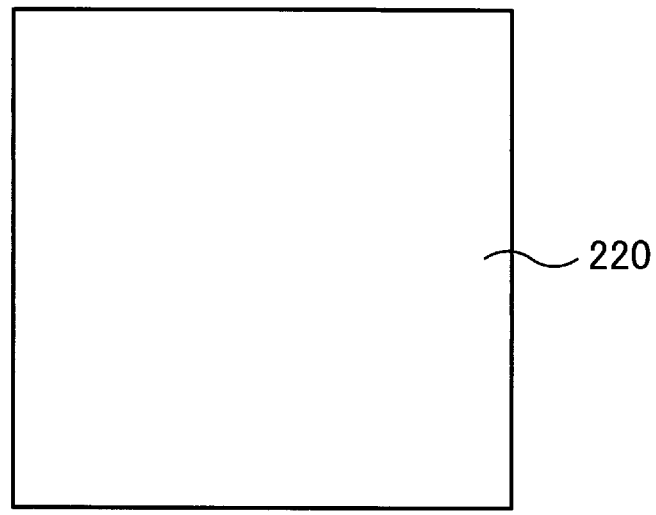
FIGS. 11A and 11B are views for explaining how to form a diamond layer (part 1)
Figure 11B:
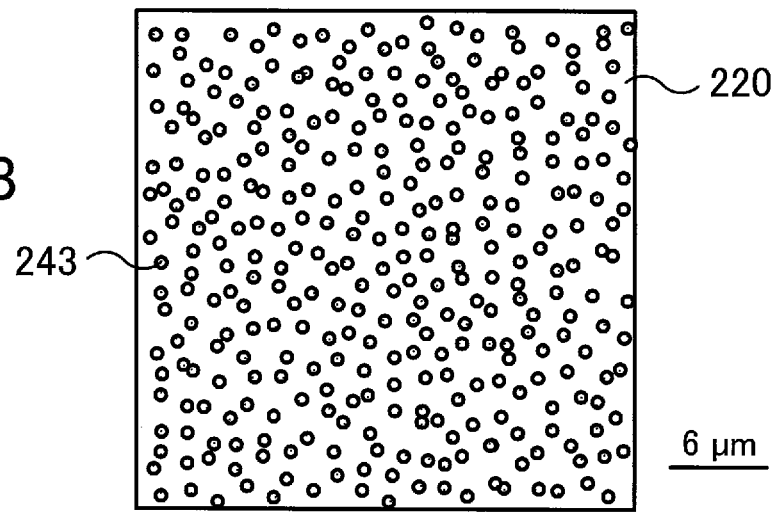
Figure 12A:
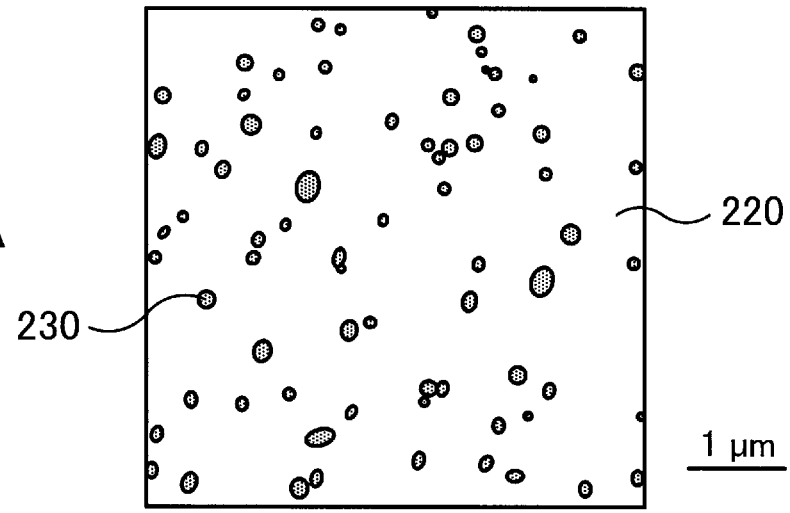
FIGS. 12A and 12B are views for explaining how to form a diamond layer (part 2)
Figure 12B:
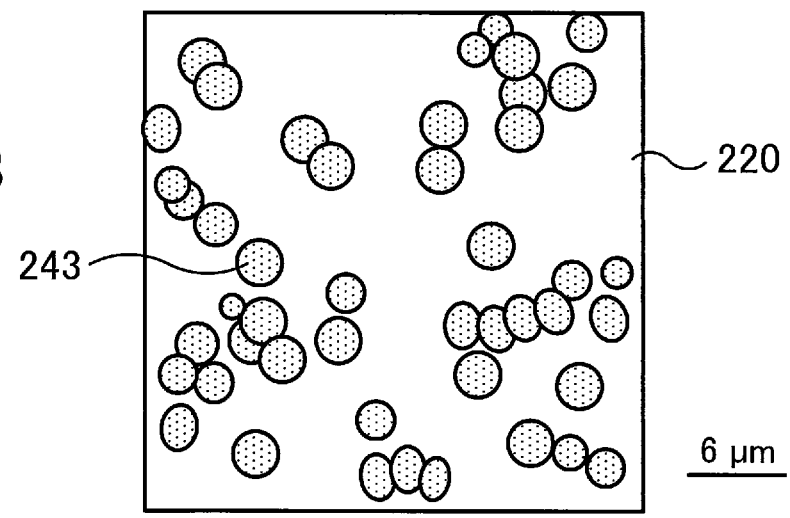

FIG. 11A is a view of an AFM image of an insulating layer 220 on which no metal particles 230 are formed. FIG. 11B is a view of an AFM image (of a crystal growth initial layer) obtained when a diamond layer 240 is formed by crystal growth on the insulating layer 220 on which no metal particles 230 are formed. FIG. 12A is a view of an AFM image of an insulating layer 220 where metal particles 230 are formed, corresponding to the view of FIG. 10C illustrating an AFM image after a heat treatment of a metal layer 231 is carried out. FIG. 12B is a view of an AFM image (of a crystal growth initial layer) obtained when a diamond layer 240 is formed by crystal growth on the insulating layer 220 on which the metal particles 230 are formed.

Just for comparison, the formation of diamond nuclei and the formation of a diamond layer 240 by crystal growth are performed with the above-described method on an insulating layer 220 having no metal particles 230 as illustrated in FIG. 11A. In this case, as illustrated in FIG. 11B, diamond grains 243 with a grain size of about several nanometers are formed in a crystal growth initial layer on the insulating layer 220. By contrast, the formation of diamond nuclei and the formation of a diamond layer 240 by crystal growth are performed with the above-described method under the same conditions on an insulating layer 220 having metal particles 230 formed thereon as illustrated in FIG. 12A. Thereby, diamond grains 243 are formed as illustrated in FIG. 12B. That is, in this case, as illustrated in FIG. 12B, diamond grains 243 with a grain size of about 2 μm are formed in the crystal growth initial layer on the insulating layer 220. It is confirmed that the diamond grains 243 with a relatively large grain size are formed in the crystal growth initial layer on the insulating layer 220 having the metal particles 230 formed thereon.

As described above, the metal particles 230 are formed with the prescribed surface density and particle size on the insulating layer 220 (FIGS. 9A and 9B), and then the formation of diamond nuclei and the crystal growth of the diamond layer 240 are performed under the prescribed conditions. Thereby, diamond grains with a relatively large grain size are formed in the crystal growth initial layer on the insulating layer 220. Then, the crystal growth is further promoted in this state, thereby forming a continuous diamond layer 240 with a prescribed thickness on the insulating layer 220 (FIG. 9C). As a result, the semiconductor device 100 illustrated in FIG. 7 or 9C is obtained.

Diamond grains with a relatively large grain size are formed in the diamond layer 240, and the possibility of forming diamond grains with a relatively small grain size in its crystal growth initial layer is reduced. This means that the crystal growth initial layer, which is an area closer to the structure 101 that generates heat, has a high thermal conductivity, and therefore the diamond layer 240 has a high thermal conductivity as a whole. The diamond layer 240 configured as described above improves the thermal conductivity between the diamond layer 240 and the structure 101 that generates heat, which in turn effectively reduces the possibilities of overheating in the structure 101 and performance deterioration and damage to the HEMT due to the overheating. For example, by preventing overheating in the substrate 10, a decrease in the mobility of electrons as carriers is effectively suppressed, which enables the semiconductor device 100 to achieve high output. As a result, the semiconductor device 100 configured as described above has high performance and high quality.

In this connection, in the semiconductor device 100, a thinner insulating layer 220 is preferable in an attempt to reduce the thermal resistance between the structure 101 and the diamond layer 240. In addition, the insulating layer 220 may be provided in such a manner as to cover the structure 101 entirely or partially.

Third Embodiment

Figure 13:
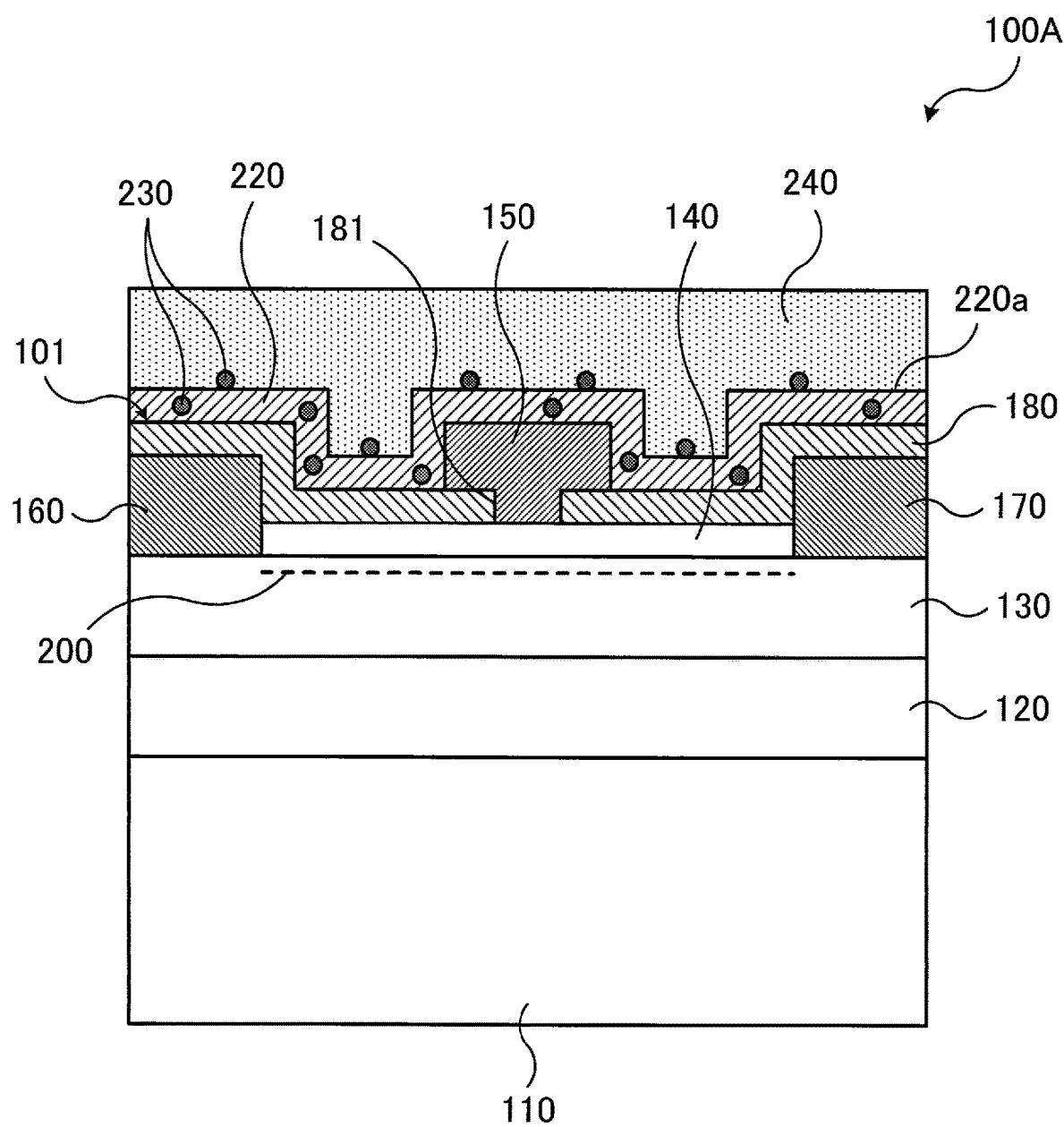
FIG. 13 is a view for explaining an example of a semiconductor device according to a third embodiment.

FIG. 13 is a view for explaining an example of a semiconductor device according to a third embodiment. FIG. 13 is a cross-sectional view schematically illustrating a main part of the example semiconductor device.

The semiconductor device 100A illustrated in FIG. 13 is different from the above-described semiconductor device 100 of the second embodiment in that the semiconductor device 100A has metal particles 230 embedded inside an insulating layer 220 as well as metal particles 230 exposed on the surface 220a of the insulating layer 220.

As with the above-described semiconductor device 100, in the semiconductor device 100A, diamond nuclei are formed on metal particles 230 exposed on the surface 220a of the insulating layer 220, and diamond grains are grown by crystal growth using the diamond nuclei as starting material, thereby forming a diamond layer 240. Here, the surface density and particle size of the metal particles 230 that are exposed on the surface 220a of the insulating layer 220 are controlled in order to control the surface density of the diamond nuclei and to control the grain size and quantity of the diamond grains that are formed by crystal growth.

Figure 14A:
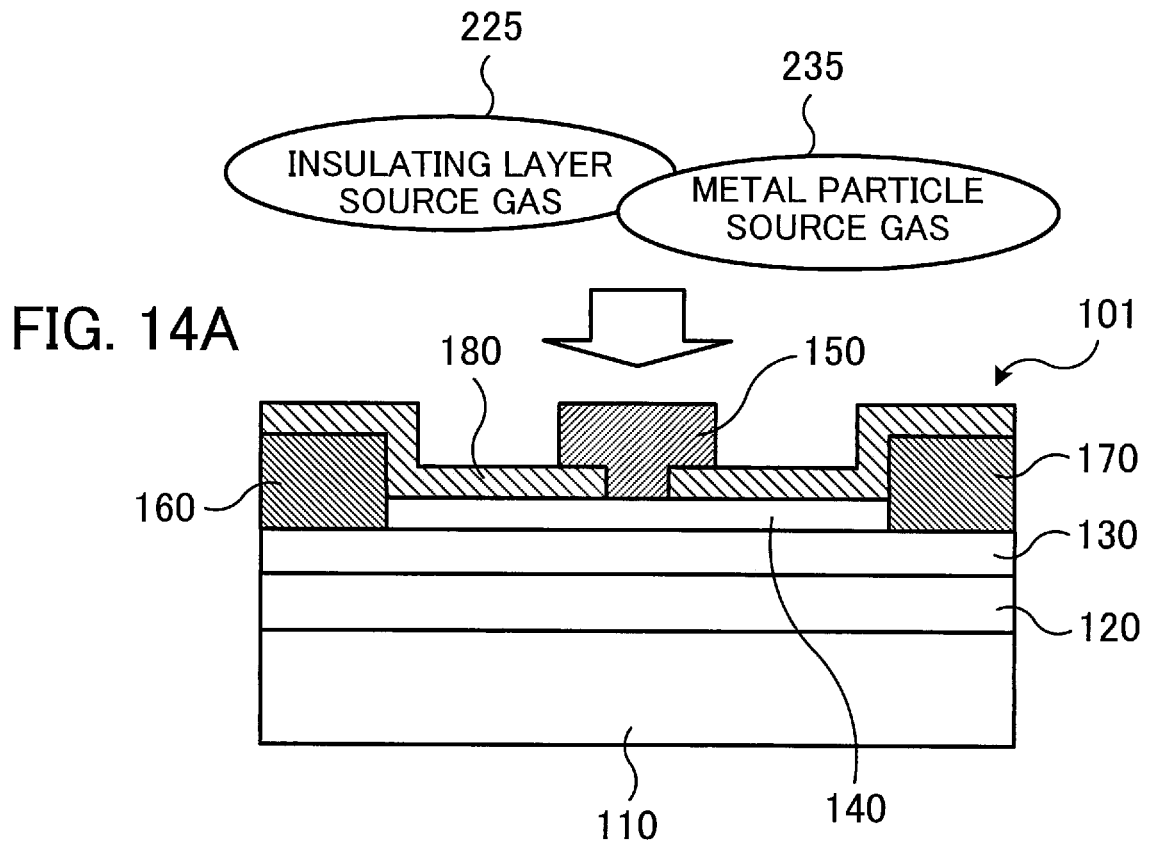
FIGS. 14A and 14B are views for explaining an example of how to manufacture a semiconductor device according to the third embodiment.
Figure 14B:
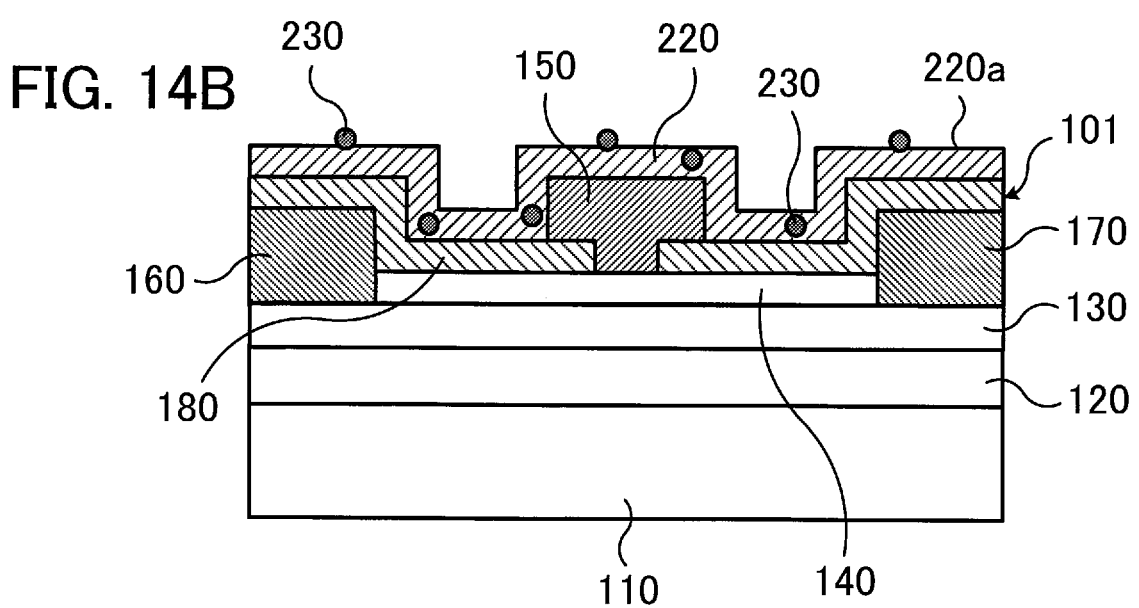

In the manufacture of the semiconductor device 100A, a structure 101 is formed in the same way as the example process of FIGS. 8A to 8C described in the second embodiment, and then a method illustrated in FIGS. 14A and 14B is employed, for example, to form an insulating layer 220 having metal particles 230 formed on the surface 220a thereof and inside thereof.

FIGS. 14A and 14B are views for explaining an example of how to manufacture a semiconductor device according to the third embodiment. FIGS. 14A and 14B are each a cross-sectional view schematically illustrating a main part of the example process of forming metal particles and an insulating layer.

For example, at the time of forming an insulating layer 220 of SiN or another using plasma-enhanced CVD, source gases (metal particle source gas) 235 such as Ni for metal particles 230 are supplied together with source gases (insulating layer source gas) 225 for the insulating layer 220 to the structure 101, as illustrated in FIG. 14A. Silane ($SiH_4$), a variety of organosilicon compounds, $N_2$, $NH_3$, and others are used for the insulating layer source gas 225. A variety of metal compounds such as nickel chloride are used for the metal particle source gas 235.

By supplying the metal particle source gas 235 together with the insulating layer source gas 225, the insulating layer 220 is formed on the structure 101 and metal particles 230 are formed on the surface 220a of and inside of the insulating layer 220, as illustrated in FIG. 14B. For example, a mixing ratio of the insulating layer source gas 225 and the metal particle source gas 235 is controlled in order to control the surface density and particle size of the metal particles 230 that are formed on the surface 220a of the insulating layer 220. In addition, a heat treatment may be further carried out on the insulating layer 220 having the metal particles 230 formed on the surface 220a thereof and inside thereof (on the structure 101 on which the insulating layer 220 is provided) so that the surface density and particle size of the metal particles 230 on the surface 220a of the insulating layer 220 are controlled by the aggregation of the metal particles 230.

In addition, by supplying the metal particle source gas 235 together with the insulating layer source gas 225, a state may be obtained in which not particles but components (metal compounds or elements) of the metal particle source gas 235 are introduced on the surface 220a of and inside of the insulating layer 220 formed on the structure 101. Then, by carrying out a heat treatment in this state under an inert gas atmosphere or a reducing gas atmosphere, metal particles 230 are formed on the surface 220a of or inside of the insulating layer 220 as illustrated in FIG. 14B. At this time, the conditions of the heat treatment may be controlled to control the surface density and particle size of the metal particles 230 that are formed on the surface 220a of the insulating layer 220.

In addition, a plasma treatment or etching process may be performed on the insulating layer 220 having the metal particles 230 formed thereon and therein, obtained by supplying the metal particle source gas 235 together with the insulating layer source gas 225 or by supplying these gases and then carrying out a heat treatment. The plasma treatment or etching process may be performed to expose metal particles 230 on the surface 220a of the insulating layer 220 and to thereby control the surface density and particle size of the metal particles 230 that are exposed on the surface 220a.

For example, after the formation of the insulating layer 220 having the metal particles 230 formed on the surface 220a thereof and inside thereof in the manner described above, a diamond layer 240 is formed in accordance with the example process of FIG. 9C described in the second embodiment. As a result, the semiconductor device 100A as illustrated in FIG. 13 is obtained.

The surface density and particle size of the metal particles 230 that are exposed on the surface 220a of the insulating layer 220 are controlled in order to control the surface density of diamond nuclei and to control the grain size and quantity of diamond grains that are formed by crystal growth. This makes it possible to form the diamond layer 240 with a high thermal conductivity and accordingly to improve the thermal conductivity between the structure 101 and the diamond layer 240. As a result, the semiconductor device 100A configured as described above has high performance and high quality while effectively reducing the possibilities of overheating in the structure 101 and performance deterioration and damage to the HEMT due to the overheating.

Fourth Embodiment

Figure 15:
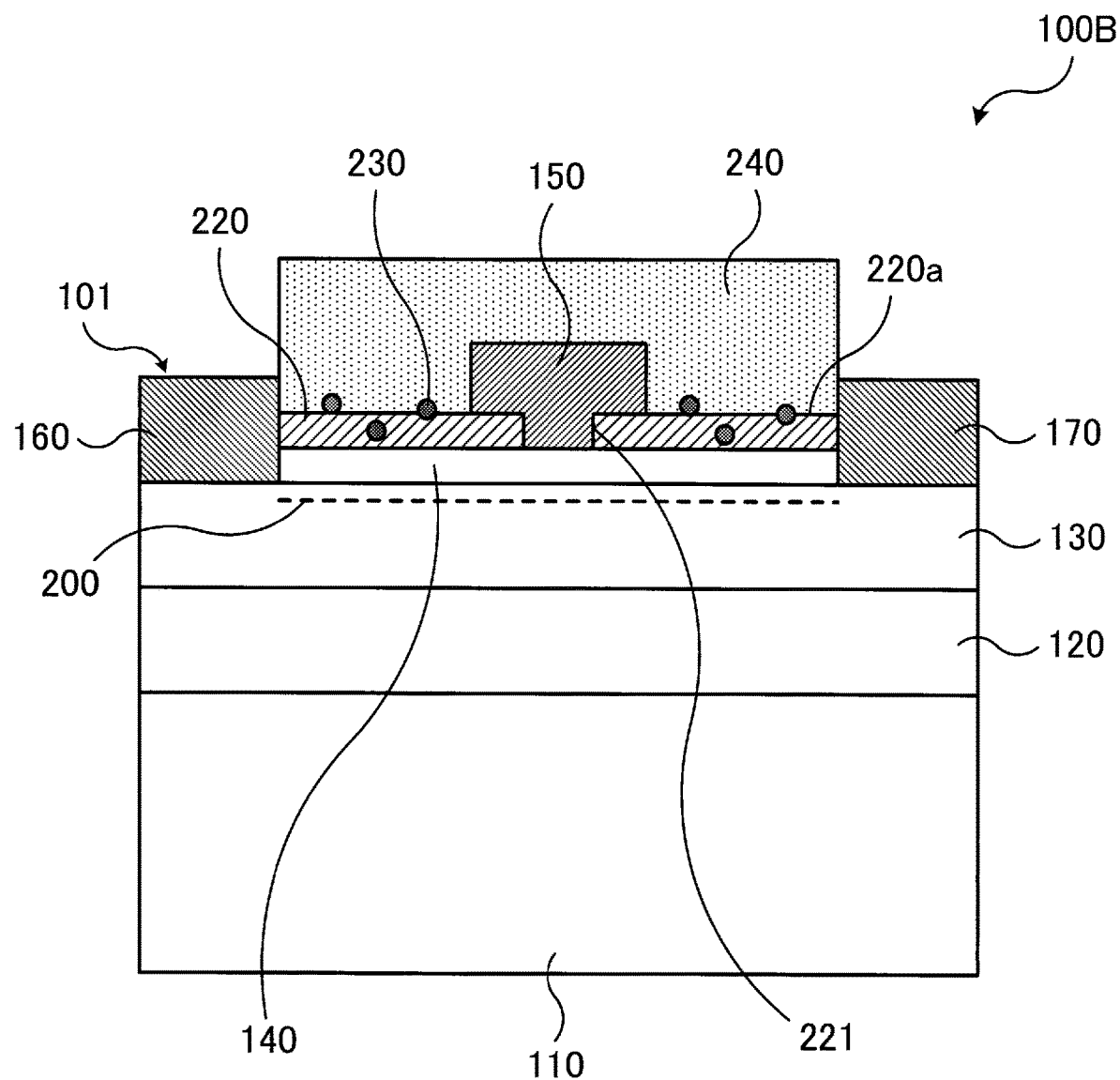
FIG. 15 is a view for explaining an example of a semiconductor device according to a fourth embodiment.

FIG. 15 is a view for explaining an example of a semiconductor device according to a fourth embodiment. FIG. 15 is a cross-sectional view schematically illustrating a main part of the example semiconductor device.

The semiconductor device 100B illustrated in FIG. 15 includes an insulating layer 220 having metal particles 230 formed thereon and therein, on a barrier layer 140 of a structure 101 (here, an insulating layer 180 as described above is not included). A gate electrode 150 and the barrier layer 140 are connected to each other (via a cap layer or the like if it is interposed therebetween) in an opening 221 provided in the insulating layer 220 having the metal particles 230 formed thereon and therein. A diamond layer 240 is provided on the insulating layer 220 having the metal particles 230 formed thereon and therein and on the gate electrode 150.

The semiconductor device 100B has a configuration in which the insulating layer 220 having the metal particles 230 formed thereon and therein is not provided on the gate electrode 150, source electrode 160, or drain electrode 170 and an insulating layer 180 as described in the second and third embodiment is not provided. This configuration makes it possible to make thinner a layer of insulating material with a relatively low thermal conductivity that is provided between the structure 101 and the diamond layer 240 or even to eliminate such a layer from the semiconductor device 100B. This further improves the thermal conductivity between the structure 101 and the diamond layer 240.

To manufacture the semiconductor device 100B, a method illustrated in FIGS. 16A to 16C, 17A, and 17B is employed.

FIGS. 16A to 16C, 17A, and 17B are views for explaining an example of how to manufacture a semiconductor device according to the fourth embodiment. FIGS. 16A to 16C, 17A, and 17B are each a cross-sectional view schematically illustrating a main part of the example process of manufacturing a semiconductor device.

Figure 16A:
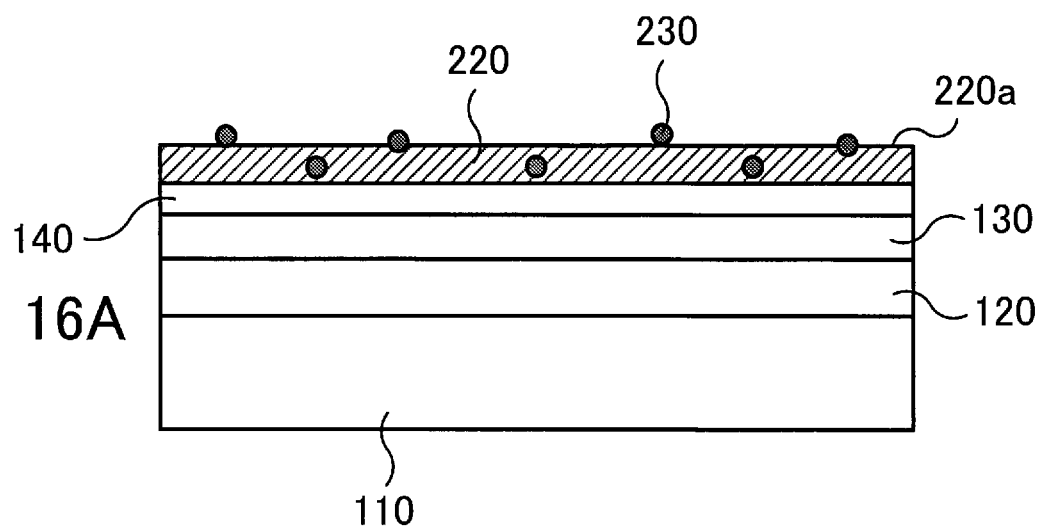
FIGS. 16A to 16C are views for explaining an example of how to manufacture a semiconductor device according to the fourth embodiment (part 1)

First, as illustrated in FIG. 16A, an initial layer (not illustrated) and buffer layer 120, a channel layer 130, and a barrier layer 140 are formed in this order on a substrate 110 by crystal growth using MOVPE. For example, the crystal growth of these layers is performed in accordance with the example process of FIG. 8A described in the second embodiment. After the crystal growth of the layers, an insulating layer 220 where metal particles 230 are formed on the surface 220a of and inside of the insulating layer 220 is formed on the barrier layer 140, as illustrated in FIG. 16A. For example, this insulating layer 220 is formed in accordance with the example process of FIGS. 14A and 14B described in the third embodiment. In this connection, the insulating layer 220 provided on the barrier layer 140 has metal particles 230 with a controlled surface density and particle size on the surface 220a thereof.

Figure 16B:
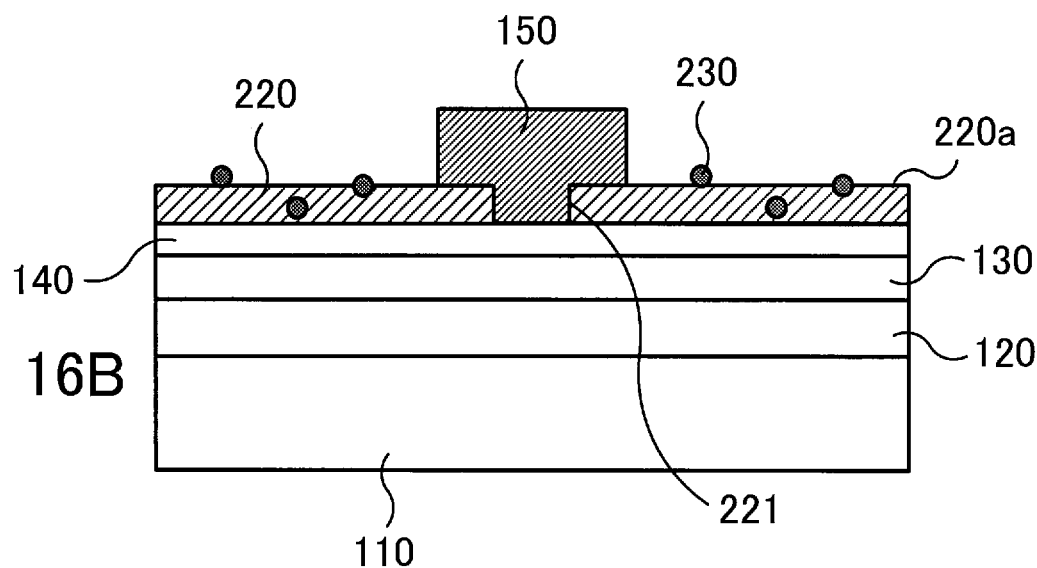

After forming the insulating layer 220 having the metal particles 230 formed on the surface 220a thereof and inside thereof, the gate electrode 150 is formed as illustrated in FIG. 16B. For example, an opening 221 is formed in an area of the insulating layer 220 where the gate electrode 150 is to be formed, and then an electrode metal is formed therein in accordance with the example process of FIG. 8C described in the second embodiment.

Figure 16C:
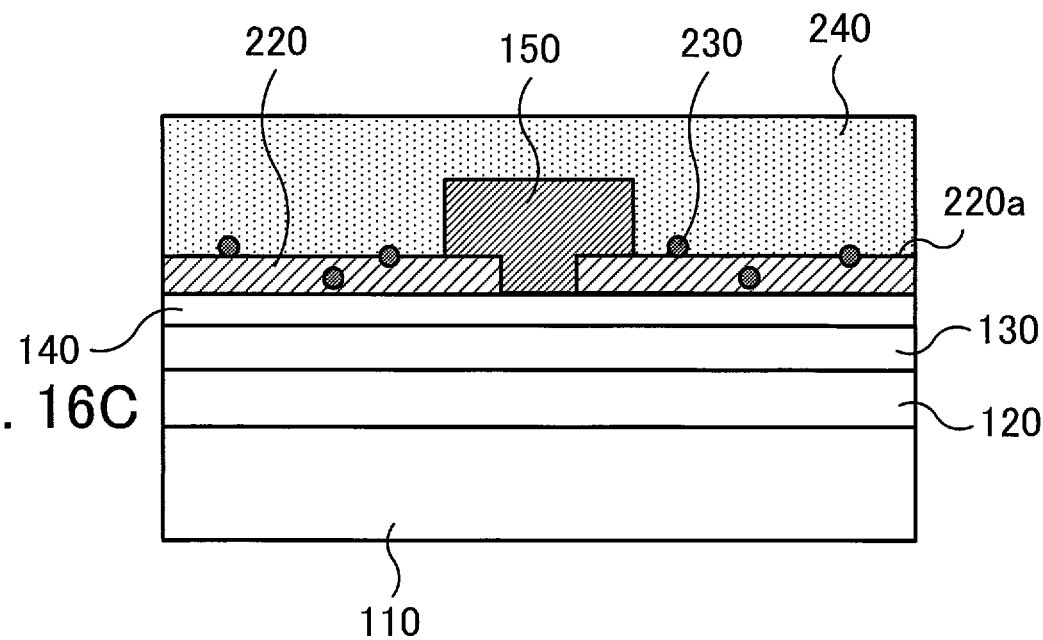

After the gate electrode 150 is formed, a diamond layer 240 is formed on the gate electrode 150 and the insulating layer 220 having the metal particles 230 formed on the surface 220a thereof and inside thereof, as illustrated in FIG. 16C. The diamond layer 240 is formed in accordance with the example process of FIG. 9C described in the second embodiment. By controlling the surface density and particle size of the metal particles 230 that are formed on the surface 220a of the insulating layer 220, diamond grains with a relatively large grain size are formed in the crystal growth initial layer, and then the crystal growth is promoted in this state, so that the diamond layer 240 is formed at a prescribed thickness.

In this connection, diamond grains with a large grain size do not always need to be formed on the gate electrode 150. Since no insulating layer with a relatively low thermal conductivity is interposed between the gate electrode 150 and the diamond layer 240 (its diamond grains), a good thermal conductivity is obtained between the gate electrode 150 and the diamond layer 240 even when the diamond grains do not have a large grain size.

Figure 17A:
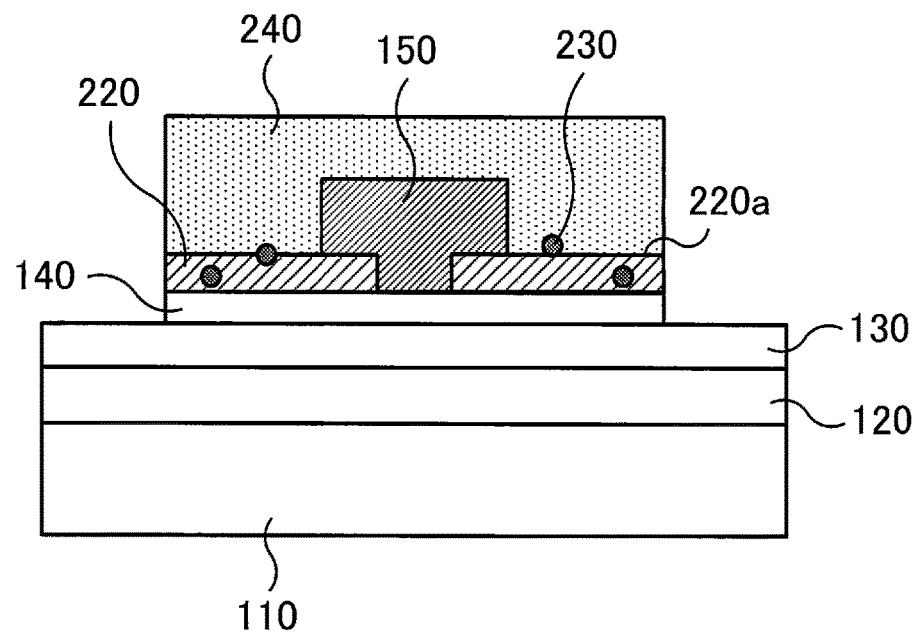
FIGS. 17A and 17B are views for explaining an example of how to manufacture a semiconductor device according to the fourth embodiment (part 2)

After the diamond layer 240 is formed, the diamond layer 240, insulating layer 220 having the metal particles 230 formed thereon and therein, and the barrier layer 140 are removed from areas where the source electrode 160 and drain electrode 170 are to be formed, as illustrated in FIG. 17A. For example, photolithography and etching techniques are used for the removal of these layers.

Figure 17B:
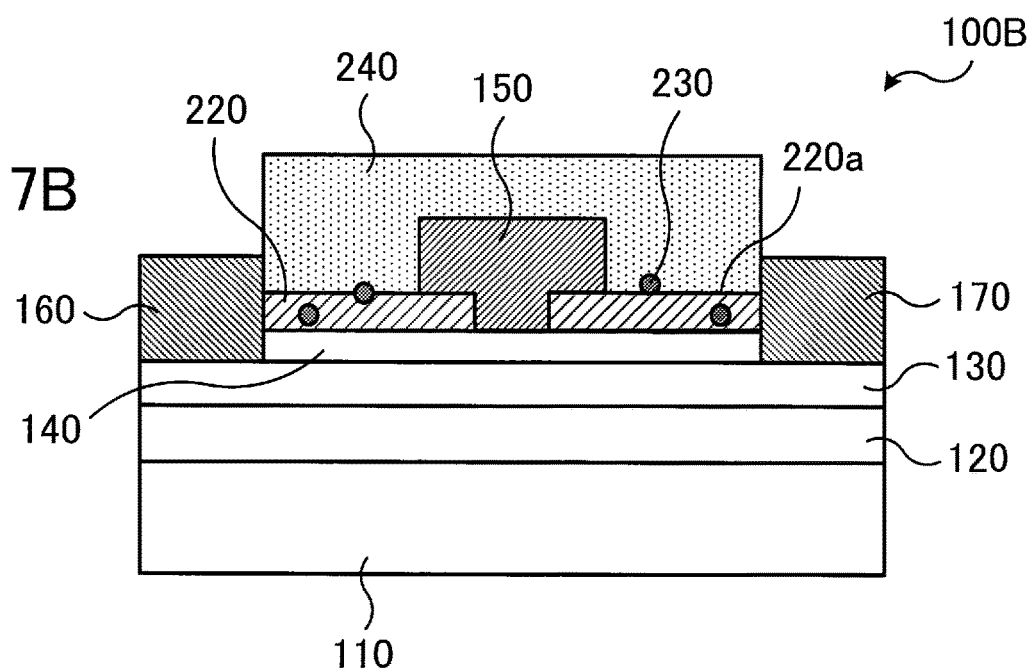

Then, the source electrode 160 and drain electrode 170 are formed, as illustrated in FIG. 17B. For example, an electrode metal is formed on each area of the channel layer 130 exposed by removing the layers up to and including the barrier layer 140 for forming the source electrode 160 and drain electrode 170, so that the electrode metals form an ohmic contact.

For example, the semiconductor device 100B is manufactured by the process of FIGS. 16A to 16C, 17A, and 17B.

In this connection, this embodiment has described an example of forming the gate electrode 150 (FIG. 16B) and, after that, forming the diamond layer 240 (FIG. 16C). Alternatively, the diamond layer 240 may be formed on the insulating layer 220 having the metal particles 230 formed thereon and therein, without forming the gate electrode 150, and after the formation of the diamond layer 240, an opening that reaches the barrier layer 140 is formed with an etching technique or the like and the gate electrode 150 may be formed in the opening.

Fifth Embodiment

Figure 18:
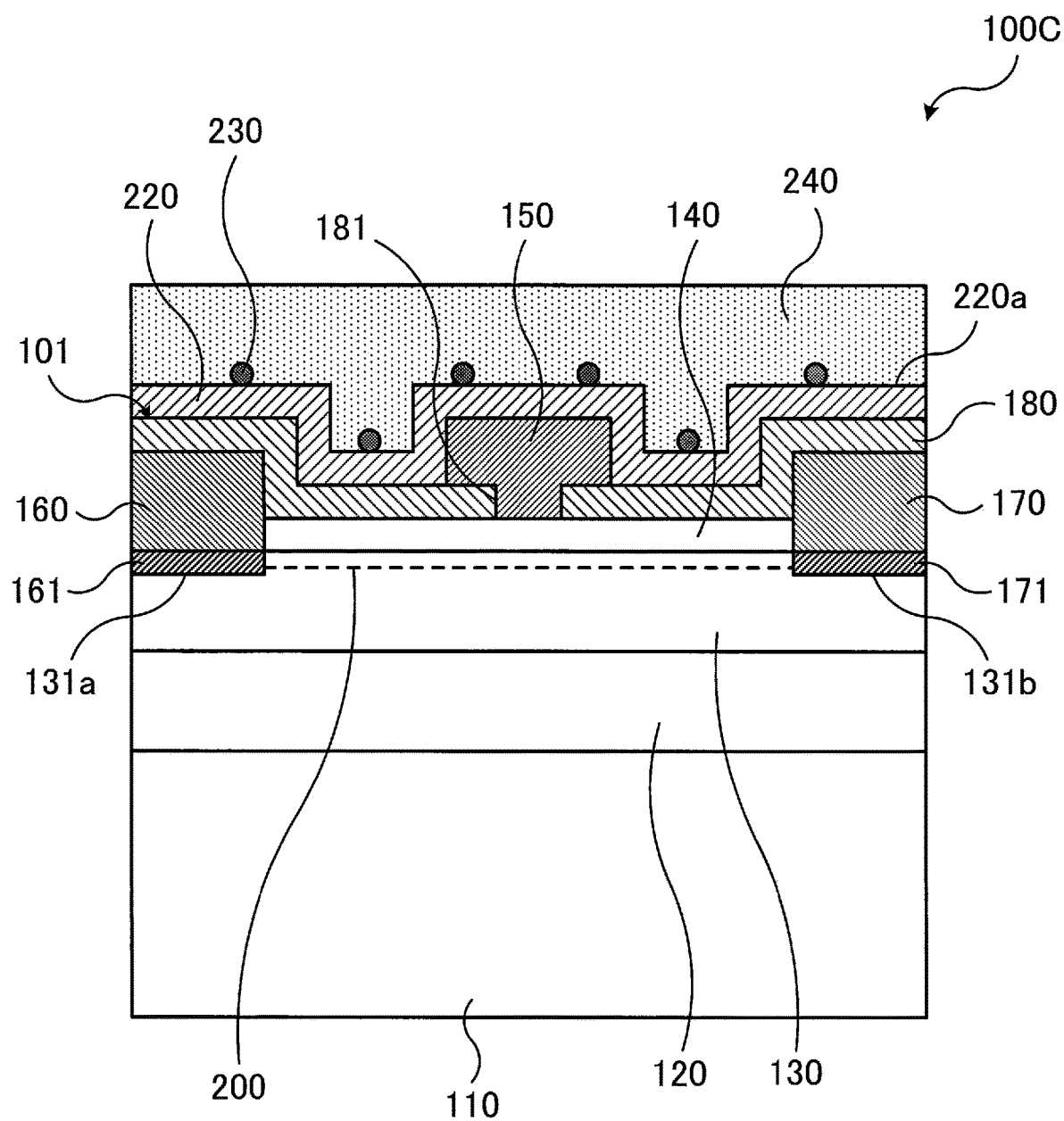
FIG. 18 is a view for explaining an example of a semiconductor device according to a fifth embodiment.

FIG. 18 is a view for explaining an example of a semiconductor device according to a fifth embodiment. FIG. 18 is a cross-sectional view schematically illustrating a main part of the example semiconductor device.

The semiconductor device 100C illustrated in FIG. 18 has a contact layer 161 and contact layer 171 respectively under the source electrode 160 and drain electrode 170 functioning as ohmic electrodes. These contact layer 161 and contact layer 171 are formed of a nitride semiconductor containing n-type impurity such as GaN (n-type GaN). Having this configuration, the semiconductor device 100C is different from the above-described semiconductor device 100 of the second embodiment. The contact layer 161 and contact layer 171 are respectively provided in a concave 131a and concave 131b formed in the channel layer 130. For example, the contact layer 161 and contact layer 171 are provided in such a manner as to be connected to 2DEG 200 generated in the channel layer 130 in the vicinity of the contact interface with the barrier layer 140.

The formation of the source electrode 160 and drain electrode 170 functioning as ohmic electrodes, respectively, on the contact layer 161 and contact layer 171 reduces the interconnection resistance between the source electrodes 160 and drain electrode 170, and the channel layer 130. This increases a current flowing between the source electrode 160 and the drain electrode 170, so that the semiconductor device 100C achieves high-current characteristics.

When high current flows between the source electrode 160 and the drain electrode 170 in the semiconductor device 100C, the structure 101 generates more heat. However, the heat generated in the structure 101 is transferred to the diamond layer 240 and dissipated efficiently, as described earlier. This reduces the possibility of overheating in the structure 101 and effectively suppresses a decrease in the mobility of electrons serving as carriers, which in turn effectively reduces the possibility of damage to the structure 101 due to the overheating. As a result, the semiconductor device 100C configured above has high performance and high quality while achieving high-current characteristics.

In this connection, the above-described contact layer 161 and contact layer 171 are applicable in the same manner to the above-described semiconductor device 100A of the third embodiment and the above-described semiconductor device 100B of the fourth embodiment.

Sixth Embodiment

Figure 19:
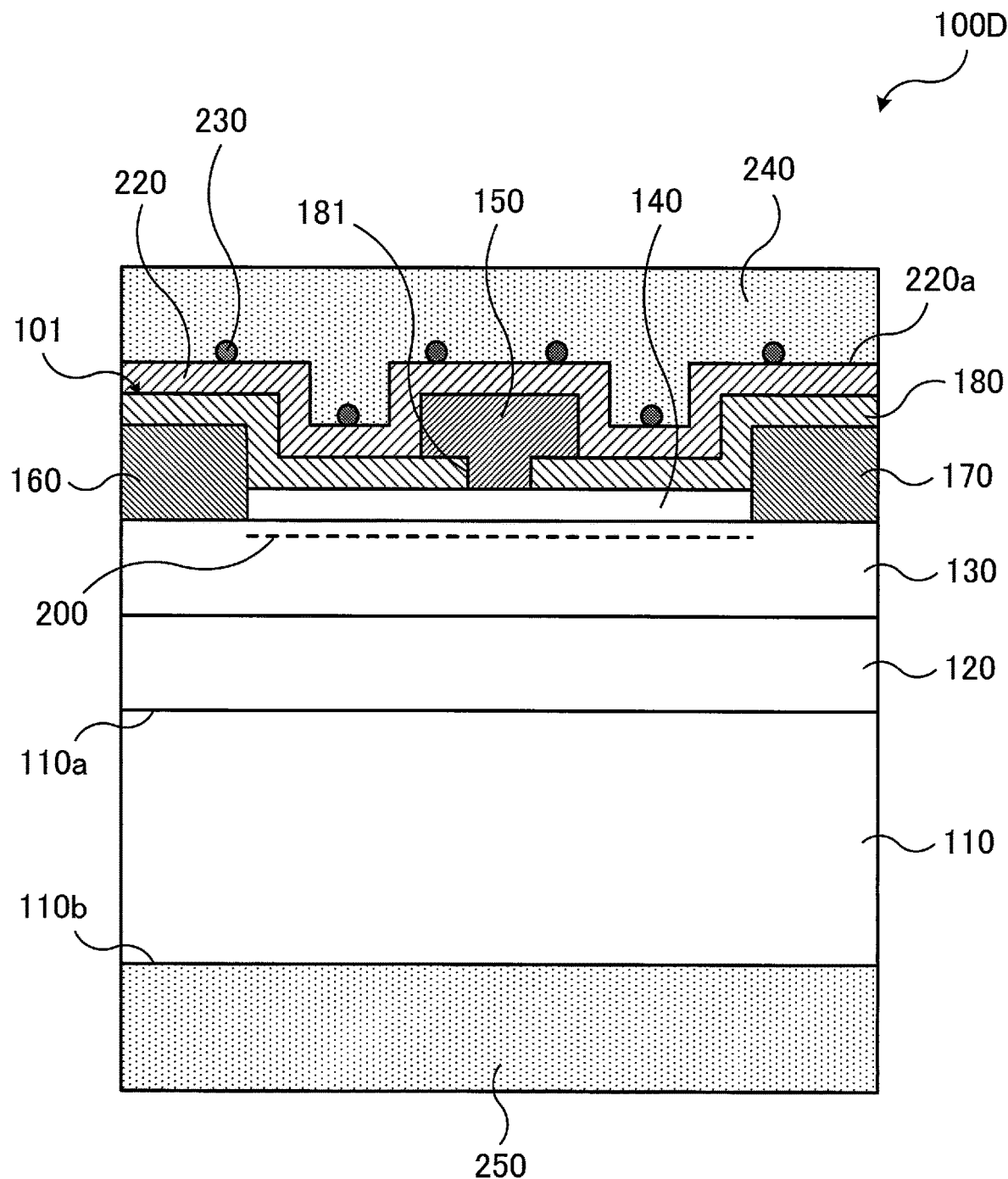
FIG. 19 is a view for explaining an example of a semiconductor device according to a sixth embodiment.

FIG. 19 is a view for explaining an example of a semiconductor device according to a sixth embodiment. FIG. 19 is a cross-sectional view schematically illustrating a main part of the example semiconductor device.

The semiconductor device 100D illustrated in FIG. 19 has a diamond layer 250 on a surface (rear surface) 110b of a substrate 110 of a structure 101 opposite to a surface (front surface) 110a of the substrate 110 on which a buffer layer 120 (and channel layer 130, barrier layer 140, and others) is provided. Having this configuration, the semiconductor device 100D is different from the above-described semiconductor device 100 of the second embodiment.

The diamond layer 250 provided on the rear surface 110b of the substrate 110 may be a diamond layer formed by crystal growth on the rear surface 110b of the substrate 110 or a diamond substrate joined to the rear surface 110b of the substrate 110 using a thermal conductive joining material or the like. Alternatively, the substrate 110 may be formed by crystal growth on a diamond substrate used as the diamond layer 250.

The semiconductor device 100D has the diamond layer 250 provided on the rear surface 110b of the substrate 110 of the structure 101, as well as a diamond layer 240 provided over the front surface 110a of the substrate 110 of the structure 101 opposite to the rear surface 110b. Heat generated in the structure 101 is transferred to the diamond layer 240 and diamond layer 250, and then is dissipated from the diamond layer 240 and diamond layer 250 to the outside. As a result, the semiconductor device 100D configured as described above has high performance and high quality while more effectively reducing the possibilities of overheating in the structure 101 and performance deterioration and damage to the HEMT due to the overheating.

In this connection, the above-described diamond layer 250 is applicable in the same manner to the above-described semiconductor device 100A of the third embodiment, the above-described semiconductor device 100B of the fourth embodiment, and the above-described semiconductor device 100C of the fifth embodiment.

Seventh Embodiment

Figure 20:
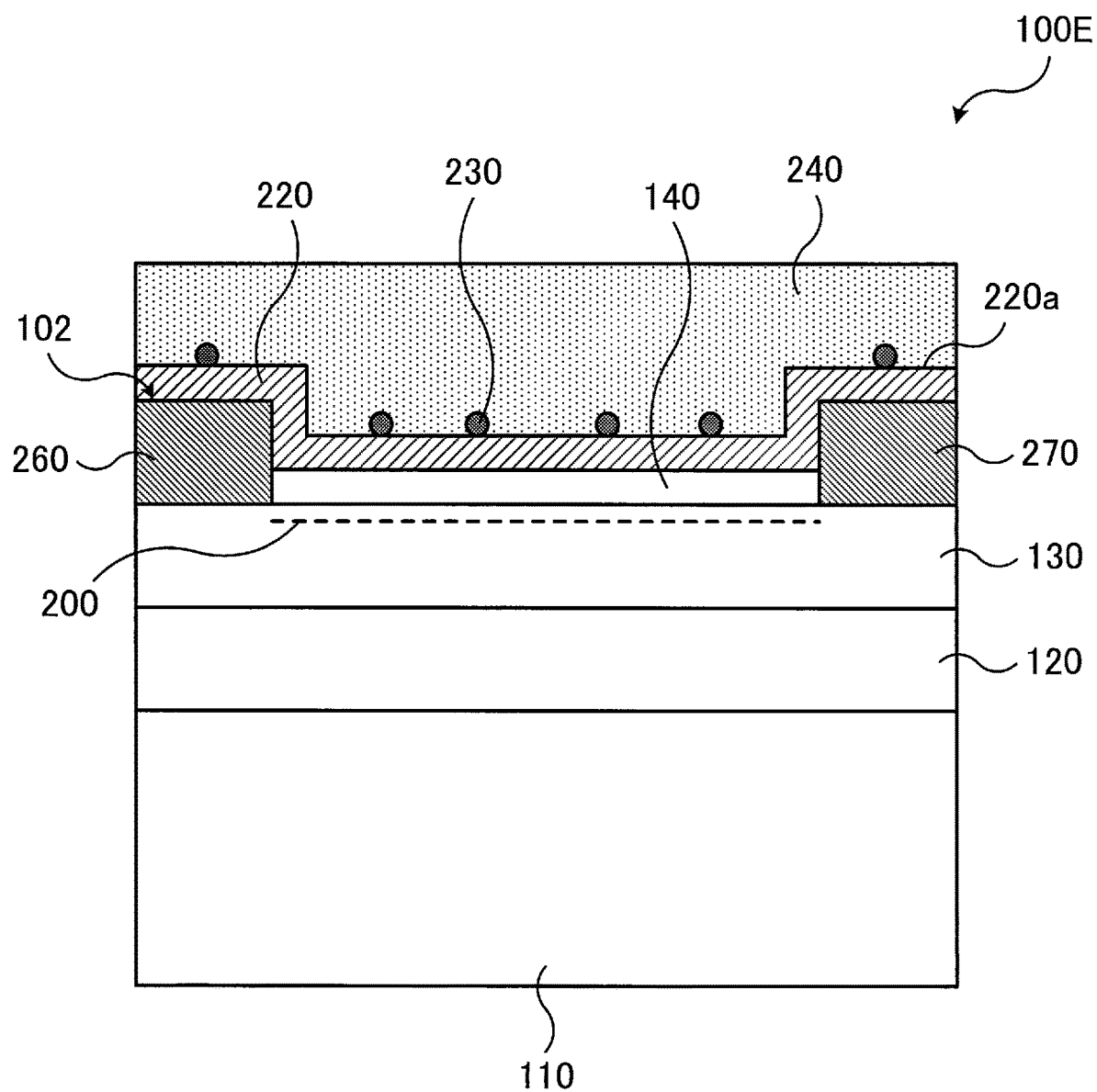
FIG. 20 is a view for explaining an example of a semiconductor device according to a seventh embodiment.

FIG. 20 is a view for explaining an example of a semiconductor device according to a seventh embodiment. FIG. 20 is a cross-sectional view schematically illustrating a main part of the example semiconductor device.

The semiconductor device 100E illustrated in FIG. 20 is an example of an SBD. The semiconductor device 100E has a structure 102 including a substrate 110, an initial layer (not illustrated) and buffer layer 120, a channel layer 130, a barrier layer 140, a cathode electrode 260 (ohmic electrode), and an anode electrode 270 (Schottky electrode). The semiconductor device 100E further includes an insulating layer 220, metal particles 230, and a diamond layer 240 on the structure 102.

For the substrate 110, the initial layer and buffer layer 120, channel layer 130, and barrier layer 140 of the semiconductor device 100E, the same materials as used in the above-described semiconductor device 100 of the second embodiment are used. For the cathode electrode 260 and anode electrode 270, metal materials are used. The cathode electrode 260 is provided on the channel layer 130 so as to function as an ohmic electrode, and the anode electrode 270 is provided on the channel layer 130 so as to function as a Schottky electrode. The cathode electrode 260 and anode electrode 270 may be provided on the barrier layer 140 as long as they function as an ohmic electrode and a Schottky electrode, respectively.

As with the above-described semiconductor device 100 of the second embodiment, the insulating layer 220 having metal particles 230 formed thereon and a diamond layer 240 are formed on the structure 102 including the substrate 110, initial layer and buffer layer 120, channel layer 130, barrier layer 140, cathode electrode 260, and anode electrode 270. That is, the insulating layer 220 having the metal particles 230 formed on the surface 220a thereof is formed on the structure 102, and the diamond layer 240 is formed on the surface 220a.

The surface density and particle size of the metal particles 230 that are exposed on the surface 220a of the insulating layer 220 are controlled in order to control the surface density of diamond nuclei and to control the grain size and quantity of diamond grains that are formed by crystal growth. This makes it possible to form the diamond layer 240 with a high thermal conductivity and accordingly to improve the thermal conductivity between the structure 102 and the diamond layer 240. As a result, the semiconductor device 100E configured as described above has high performance and high quality while effectively reducing the possibilities of overheating in the structure 102 and performance deterioration and damage to the SBD due to the overheating.

As described above, the insulating layer 220 having the metal particles 230 formed thereon and the diamond layer 240 formed on the insulating layer 220 may be provided not only on the structure 101 having the function of HEMT, as in the second embodiment, but also on the structure 102 having the function of SBD.

In this connection, as in the example described in the third embodiment, the semiconductor device 100E may include an insulating layer 220 having metal particles 230 formed on the surface 220a thereof and inside thereof. Further, as in the example described in the fourth embodiment, the semiconductor device 100E may have a configuration in which the insulating layer 220 is not provided on the cathode electrode 260 or anode electrode 270. Still further, as in the example described in the fifth embodiment, the semiconductor device 100E may have another layer, such as a contact layer, under the cathode electrode 260 and under the anode electrode 270. Still further, as in the example described in the sixth embodiment, the semiconductor device 100E may have an additional diamond layer 250 on the rear surface 110b of the substrate 110.

The semiconductor devices 1, 100, 100A, 100B, 100C, 100D, and 100E having the configurations described in the first to seventh embodiments are applicable to a variety of electronic devices. As examples, the following describes cases where a semiconductor device configured as described above is applied to a semiconductor package, a power factor correction circuit, a power supply device, and an amplifier.

Eighth Embodiment

An eighth embodiment describes an example where a semiconductor device configured as described above is applied to a semiconductor package.

Figure 21:
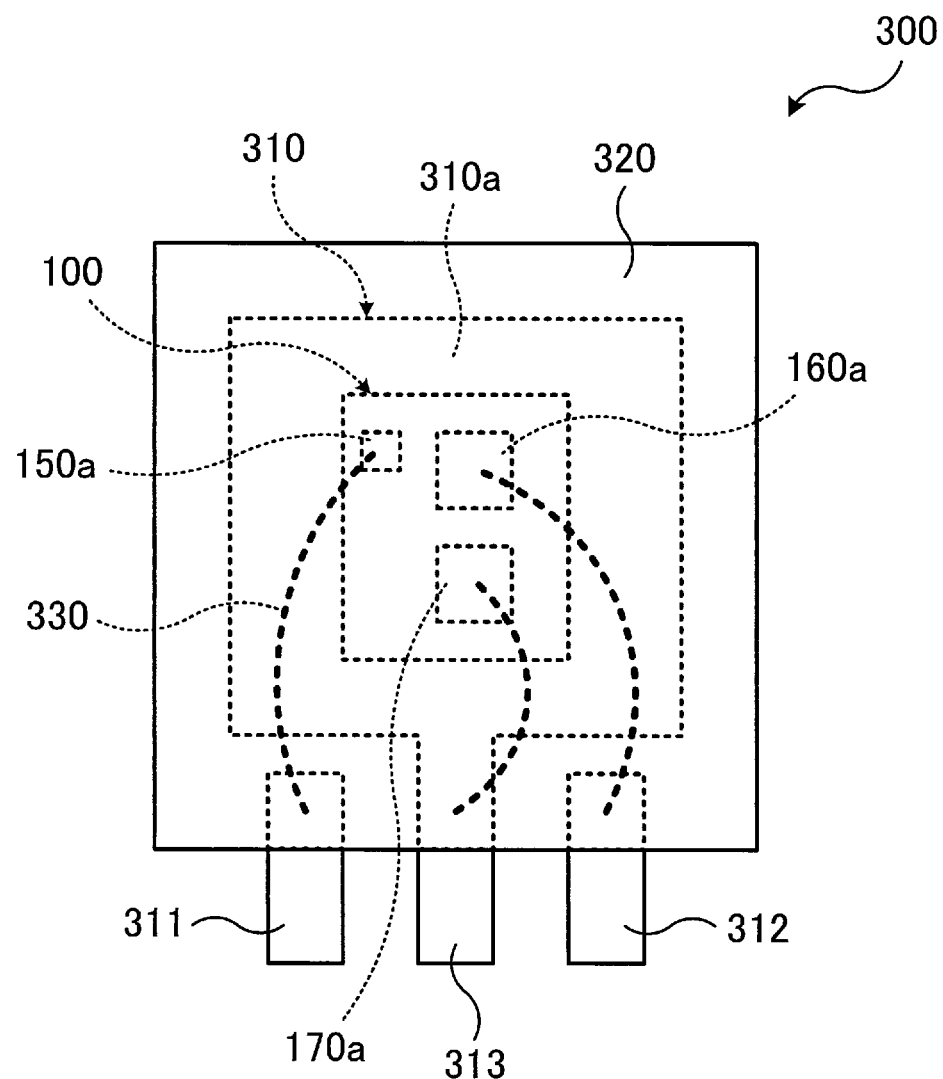
FIG. 21 is a view for explaining an example of a semiconductor package according to an eighth embodiment.

FIG. 21 is a view for explaining an example of a semiconductor package according to the eighth embodiment. FIG. 21 is a plan view schematically illustrating a main part of the example semiconductor package.

The semiconductor package 300 illustrated in FIG. 21 is an example of a discrete package. The semiconductor package 300 includes the semiconductor device 100 described in the second embodiment, a lead frame 310 on which the semiconductor device 100 is mounted, and a resin 320 sealing these, for example.

The semiconductor device 100 is mounted on a die pad 310a of the lead frame 310 using a die attach material or the like (not illustrated). The semiconductor device 100 is provided with a pad 150a connected to the gate electrode 150, a pad 160a connected to the source electrode 160, and a pad 170a connected to the drain electrode 170. These pads 150a, 160a, and 170a are respectively connected to a gate lead 311, source lead 312, and drain lead 313 of the lead frame 310 with wires 330, such as Al wires. The lead frame 310, the semiconductor device 100 mounted on the lead frame 310, and the wires 330 connecting these are sealed by the resin 320 in such a manner that each of the gate lead 311, source lead 312, and drain lead 313 is partially exposed.

For example, using the above-described semiconductor device 100 of the second embodiment, the semiconductor package 300 having the above configuration is obtained. As described earlier, in the semiconductor device 100, the diamond layer 240 with a high thermal conductivity is formed on the surface 220a of the insulating layer 220 having the metal particles 230 formed thereon, to thereby improve the thermal conductivity between the structure 101 and the diamond layer 240. This effectively reduces the possibilities of overheating in the structure 101 and performance deterioration and damage to the HEMT. Using the semiconductor device 100 having such superior properties, the semiconductor package 300 with high performance and high quality is configured.

This embodiment uses the semiconductor device 100 by way of example. Likewise, another semiconductor device 100A, 100B, 100C, or 100D or the like having the function of HEMT may be used to configure a semiconductor package with high performance and high quality.

In addition, the semiconductor device 100E or the like having the function of SBD may be used to configure a semiconductor package. As described earlier, the semiconductor device 100E and the like improve the thermal conductivity between the structure 102 having the function of SBD and the diamond layer 240, which in turn effectively reduces the possibilities of overheating in the structure 102 and performance deterioration and damage to the SBD due to the overheating. Using the semiconductor device 100E or the like having such superior properties, a semiconductor package with high performance and high quality is configured.

Ninth Embodiment

Here, a ninth embodiment describes an example where semiconductor devices configured as described above are applied to a power factor correction circuit.

Figure 22:
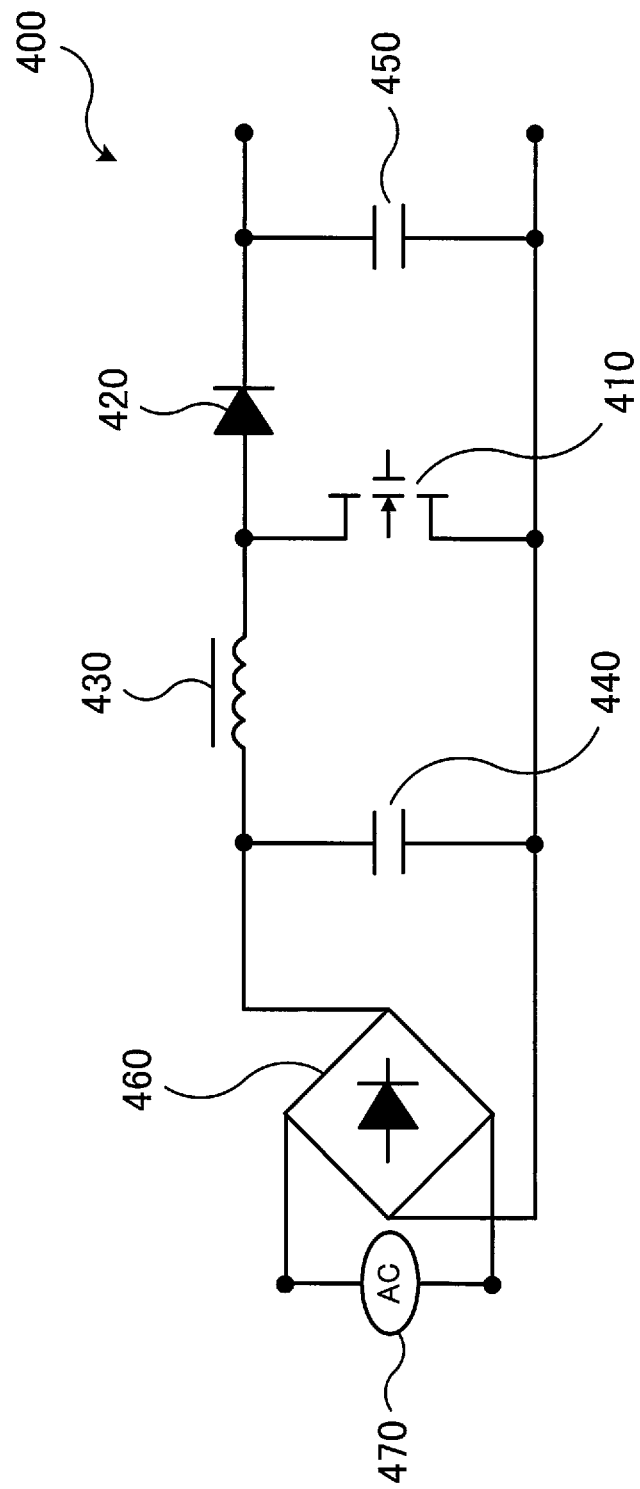
FIG. 22 is a view for explaining an example of a power factor correction circuit according to a ninth embodiment.

FIG. 22 is a view for explaining an example of a power factor correction circuit according to the ninth embodiment. FIG. 22 is an equivalent circuit diagram of the example power factor correction circuit.

The power factor correction (PFC) circuit 400 illustrated in FIG. 22 includes a switching element 410, a diode 420, a choke coil 430, a capacitor 440, a capacitor 450, a diode bridge 460, and an alternating current power supply 470 (AC).

In the PFC circuit 400, the drain electrode of the switching element 410, the anode terminal of the diode 420, and one terminal of the choke coil 430 are connected to each other. The source electrode of the switching element 410, one terminal of the capacitor 440, and one terminal of the capacitor 450 are connected to each other. The other terminal of the capacitor 440 and the other terminal of the choke coil 430 are connected to each other. The other terminal of the capacitor 450 and the cathode terminal of the diode 420 are connected to each other. In addition, a gate driver is connected to the gate electrode of the switching element 410. The alternating current power supply 470 is connected between both terminals of the capacitor 440 via the diode bridge 460, so that direct current power supply (DC) is drawn from both terminals of the capacitor 450.

For example, the above-described semiconductor device 100, 100A, 100B, 100C or 100D or the like having the function of HEMT is used for the switching element 410 of the PFC circuit 400 having the above configuration. As described earlier, in the semiconductor device 100 and the others, the diamond layer 240 with a high thermal conductivity is formed on the surface 220a of the insulating layer 220 having the metal particles 230 formed thereon, to thereby improve the thermal conductivity between the structure 101 and the diamond layer 240. This effectively reduces the possibilities of overheating in the structure 101 and performance deterioration and damage to the HEMT due to the overheating. Using the semiconductor device 100 or the like having such superior properties, the PFC circuit 400 with high performance and high quality is configured.

In addition, for the diode 420 and diode bridge 460 of the PFC circuit 400, the above-described semiconductor device 100E and the like having the function of SBD may be used. As described earlier, the semiconductor device 100E and the like improve the thermal conductivity between the structure 102 having the function of SBD and the diamond layer 240, which in turn effectively reduces the possibilities of overheating in the structure 102 and performance deterioration and damage to the SBD due to the overheating. Using the semiconductor device 100E and the like having such superior properties, the PFC circuit 400 with high performance and high quality is configured.

Tenth Embodiment

A tenth embodiment describes an example where semiconductor devices configured as described above are applied to a power supply device.

Figure 23:
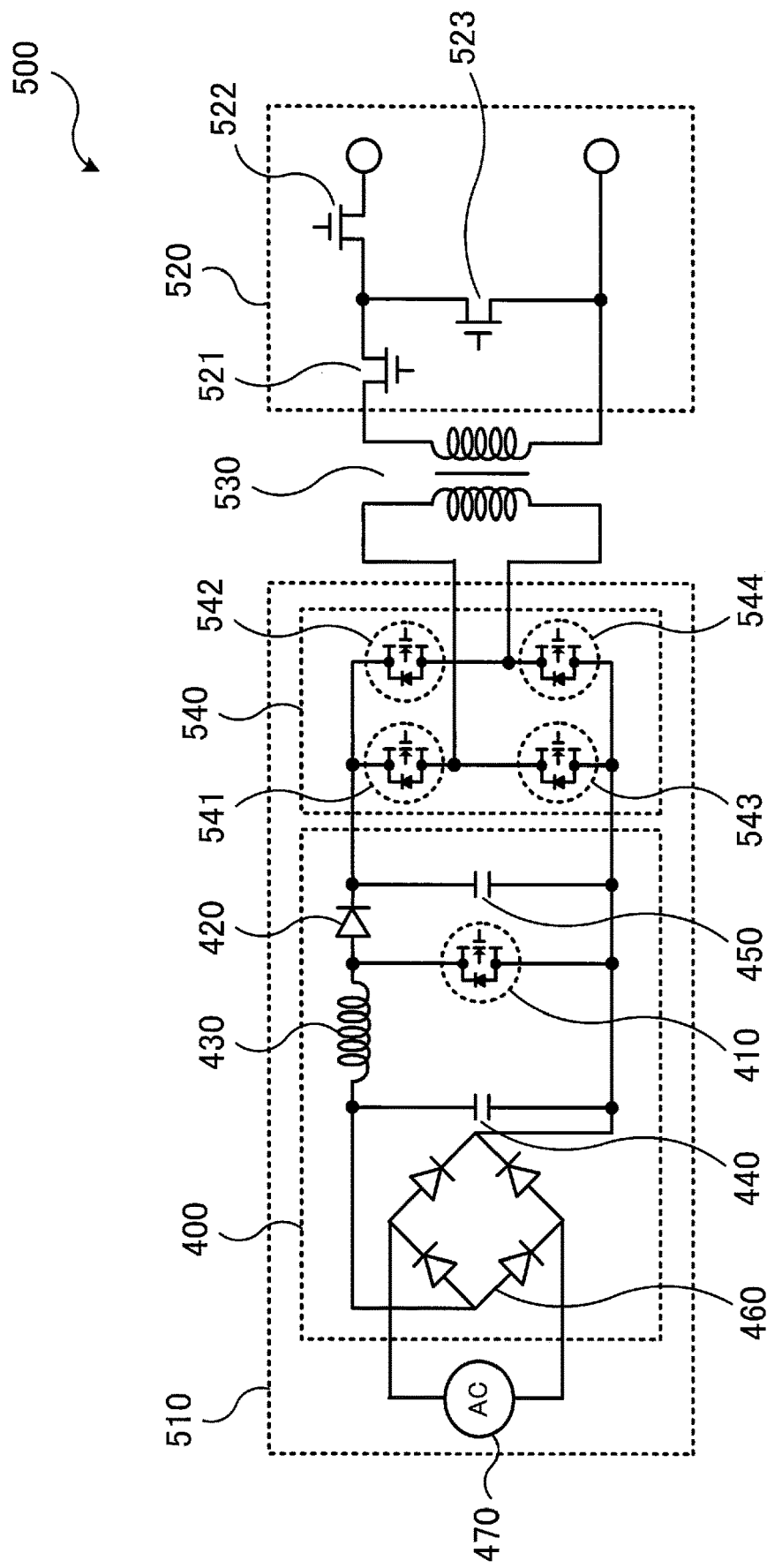
FIG. 23 is a view for explaining an example of a power supply device according to a tenth embodiment.

FIG. 23 is a view for explaining an example of a power supply device according to the tenth embodiment. FIG. 23 illustrates an equivalent circuit diagram of the example power supply device.

The power supply device 500 illustrated in FIG. 23 includes a high-voltage primary circuit 510, a low-voltage secondary circuit 520, and a transformer 530 provided between the primary circuit 510 and the secondary circuit 520. The primary circuit 510 includes a PFC circuit 400 described in the ninth embodiment and an inverter circuit connected between both terminals of a capacitor 450 of the PFC circuit 400, for example, a full-bridge inverter circuit 540. The full-bridge inverter circuit 540 includes a plurality (four in this example) of switching elements 541, 542, 543, and 544. The secondary circuit 520 includes a plurality (three in this example) of switching elements 521, 522, and 523.

For example, the semiconductor devices 100, 100A, 100B, 100C, and 100D and the like having the function of HEMT are used for a switching element 410 of the PFC circuit 400 included in the primary circuit 510 and the switching elements 541 to 544 of the full-bridge inverter circuit 540 in the power supply device 500 having the above configuration. For example, normal MIS-type FETs using silicon are used for the switching elements 521 to 523 of the secondary circuit 520 in the power supply device 500. As described earlier, in the semiconductor device 100 and the others, the diamond layer 240 with a high thermal conductivity is formed on the surface 220a of the insulating layer 220 having the metal particles 230 formed thereon, to thereby improve the thermal conductivity between the structure 101 and the diamond layer 240. This effectively reduces the possibilities of overheating in the structure 101 and performance deterioration and damage to the HEMT due to the overheating. Using the semiconductor device 100 and the like having such superior properties, the power supply device 500 with high performance and high quality is configured.

In addition, for a diode 420 and diode bridge 460 of the PFC circuit 400 included in the primary circuit 510, the semiconductor device 100E and the like having the function of SBD may be used, as described in the ninth embodiment. The PFC circuit 400 with high performance and high quality is configured using the semiconductor device 100E and the like having such superior properties. Then, the power supply device 500 with high performance and high quality is configured using the PFC circuit 400.

Eleventh Embodiment

An eleventh embodiment describes an example where semiconductor devices configured as described above are applied to an amplifier.

Figure 24:
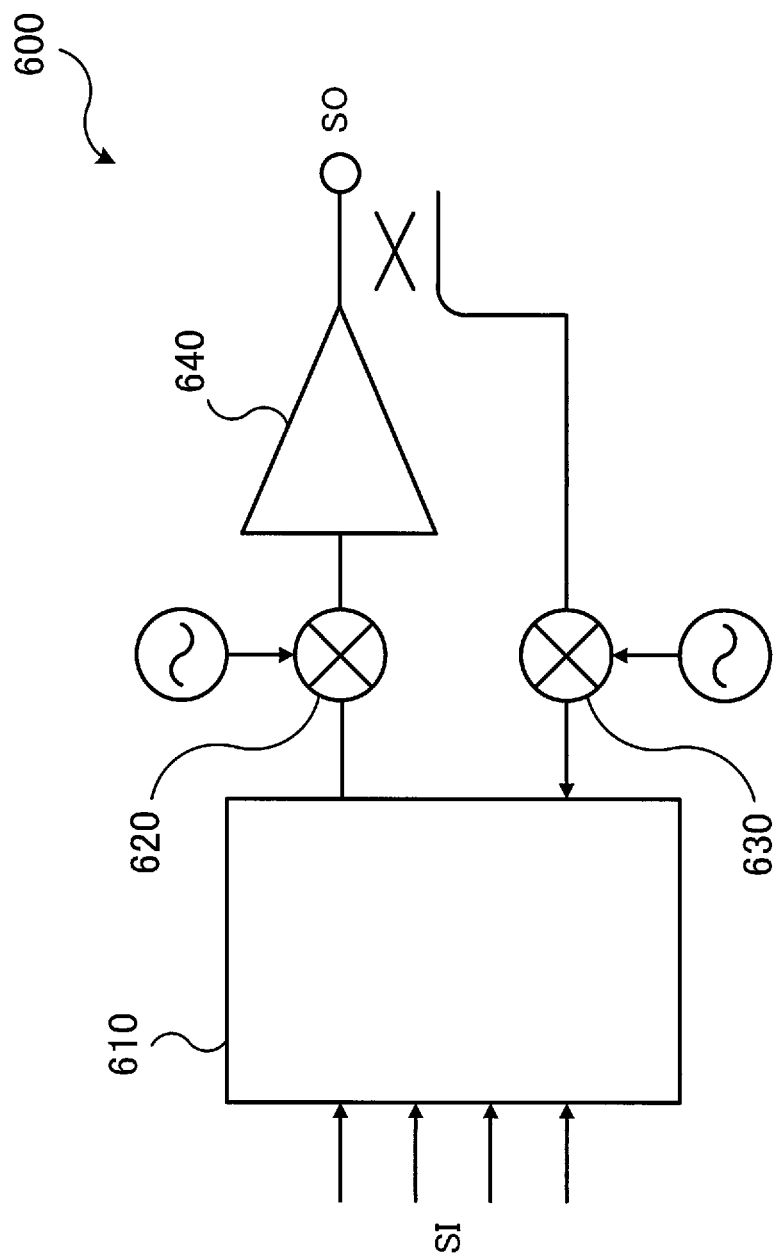
FIG. 24 is a view for explaining an example of an amplifier according to an eleventh embodiment.

FIG. 24 is a view for explaining an example of an amplifier according to the eleventh embodiment. FIG. 24 is an equivalent circuit diagram of the example amplifier.

The amplifier 600 illustrated in FIG. 24 includes a digital pre-distortion circuit 610, a mixer 620, a mixer 630, and a power amplifier 640.

The digital pre-distortion circuit 610 compensates for nonlinear distortion of an input signal. The mixer 620 mixes an input signal SI whose nonlinear distortion has been compensated for and an alternating current signal. The power amplifier 640 amplifies a signal obtained by mixing the input signal SI and the alternating current signal. For example, according to the switching of a switch, the amplifier 600 mixes an output signal SO with an alternating current signal at the mixer 630 and sends the resultant to the digital pre-distortion circuit 610. The amplifier 600 may be used as a high frequency amplifier and a high output amplifier.

For example, for the power amplifier 640 of the amplifier 600 having the above configuration, the semiconductor device 100, 100A, 100B, 100C, or 100D or the like having the function of HEMT is used. As described earlier, in the semiconductor device 100 and the others, the diamond layer 240 with a high thermal conductivity is formed on the surface 220a of the insulating layer 220 having the metal particles 230 formed thereon, to thereby improve the thermal conductivity between the structure 101 and the diamond layer 240. This effectively reduces the possibilities of overheating in the structure 101 and performance deterioration and damage to the HEMT due to the overheating. Using the semiconductor device 100 or the like having such superior properties, the amplifier 600 with high performance and high quality is configured.

In addition, in the case of using a diode as the amplifier 600, the semiconductor device 100E or the like having the function of SBD may be used for the diode. Using the semiconductor device 100E or the like having the superior properties, the amplifier 600 with high performance and high quality is configured.

Various electronic devices (the semiconductor package 300, PFC circuit 400, power supply device 500, and amplifier 600 described in the eighth to eleventh embodiments, and the like) to which the above-described semiconductor devices 100, 100A, 100B, 100C, 100D, and 100E and the like are applied may be mounted on various electronic apparatuses. Example of the electronic apparatuses include computers (personal computers, super computers, servers, and others), smartphones, mobile telephones, tablet terminals, sensors, cameras, audio equipment, measurement apparatuses, inspection apparatuses, manufacturing apparatuses, and others.

According to one aspect, the thermal conductivity between a substrate and a diamond layer provided over the substrate is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a substrate including a semiconductor layer and a plurality of electrodes over the semiconductor layer;
   an insulating layer containing silicon provided over the substrate and covering the semiconductor layer and the plurality of electrodes of the substrate, the insulating layer containing silicon being at least one of silicon oxide, silicon nitride, silicon oxynitride, silicon carbide, or silicon oxycarbide;
   a passivation film containing oxide, nitride, and oxynitride containing one type or two or more types selected from aluminum, hafnium, zirconium, titanium, tantalum, and tungsten and provided between the insulating layer containing silicon and the semiconductor layer;
   a collection of first metal particles provided on a surface of the insulating layer containing silicon; and
   a first insulating diamond layer provided on the surface of the insulating layer containing silicon, the first insulating diamond layer being in directly contact with the insulating layer containing silicon and the collection of first metal particles.

2. The semiconductor device according to claim 1, wherein a surface density of the collection of first metal particles on the surface ranges between $1\times10^4$ cm$^{-2}$ and $1\times10^{12}$ cm$^{-2}$, inclusive.

3. The semiconductor device according to claim 1, wherein a particle size of the collection of first metal particles ranges between 2 nm and 1 μm, inclusive.

4. The semiconductor device according to claim 1, wherein the collection of first metal particles contains one type or two or more types selected from iridium, platinum, nickel, molybdenum, tungsten, copper, and gold.

5. The semiconductor device according to claim 1, wherein the first insulating diamond layer has a crystal grain at a location of each of the collection of first metal particles on the surface.

6. The semiconductor device according to claim 1, wherein:
   the semiconductor layer includes
      a channel layer containing a first nitride semiconductor, and
      a barrier layer stacked on the channel layer and containing a second nitride semiconductor,
   the plurality of electrodes includes
      a gate electrode provided on an opposite side of the barrier layer from the channel layer, and
      a source electrode and a drain electrode provided on a same side of the channel layer as the gate electrode, the source electrode and the drain electrode sandwiching the gate electrode therebetween; and
   the gate electrode, the source electrode, and the drain electrode are covered with the insulating layer containing silicon.

7. The semiconductor device according to claim 1, further comprising second metal particles provided inside the insulating layer containing silicon.

8. The semiconductor device according to claim 1, further comprising a second insulating diamond layer provided on an opposite side of the substrate from the first insulating diamond layer.

9. A method of manufacturing a semiconductor device, the method comprising:
   preparing a substrate including a semiconductor layer and a plurality of electrodes over the semiconductor layer;
   forming a passivation film containing oxide, nitride, and oxynitride containing one type or two or more types selected from aluminum, hafnium, zirconium, titanium, tantalum, and tungsten over the semiconductor layer;
   forming an insulating layer containing silicon over the substrate and covering the semiconductor layer of the substrate, the plurality of electrodes of the substrate and the passivation film, the insulating layer containing silicon being at least one of silicon oxide, silicon nitride, silicon oxynitride, silicon carbide, or silicon oxycarbide;
   forming a collection of first metal particles on a surface of the insulating layer containing silicon; and
   forming a first insulating diamond layer on the surface of the insulating layer containing silicon, the first insulating diamond layer being in directly contact with the insulating layer containing silicon and the collection of first metal particles.

10. An electronic device, comprising:
    a semiconductor device including
       a substrate including a semiconductor layer and a plurality of electrodes over the semiconductor layer,
       an insulating layer containing silicon provided over the substrate and covering the semiconductor layer and the plurality of electrodes of the substrate, the insulating layer containing silicon being at least one of silicon oxide, silicon nitride, silicon oxynitride, silicon carbide, or silicon oxycarbide,
       a passivation film containing oxide, nitride, and oxynitride containing one type or two or more types selected from aluminum, hafnium, zirconium, titanium, tantalum, and tungsten and provided between the insulating layer containing silicon and the semiconductor layer;
       a collection of first metal particles provided on a surface of the insulating layer containing silicon, and
       a first insulating diamond layer provided on the surface of the insulating layer containing silicon, the first insulating diamond layer being in directly contact with the insulating layer containing silicon and the collection of first metal particles.

11. The semiconductor device according to claim 1, wherein the collection of first metal particles being in directly contact with the first insulating diamond layer is in directly contact with the insulating layer containing silicon.

12. The method of manufacturing the semiconductor device according to claim 9, wherein the collection of first metal particles being in directly contact with the first insulating diamond layer is in directly contact with the insulating layer containing silicon.

13. The electronic device according to claim 10, wherein the collection of first metal particles being in directly contact with the first insulating diamond layer is in directly contact with the insulating layer containing silicon.

* * * * *